(12) United States Patent
Hanaoka

(10) Patent No.: US 12,068,577 B2
(45) Date of Patent: Aug. 20, 2024

(54) SURFACE EMITTING LASER, SURFACE EMITTING LASER DEVICE, LIGHT SOURCE DEVICE, AND DETECTION APPARATUS

(71) Applicant: Ricoh Company, Ltd., Tokyo (JP)

(72) Inventor: Katsunari Hanaoka, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 923 days.

(21) Appl. No.: 17/011,205

(22) Filed: Sep. 3, 2020

(65) Prior Publication Data

US 2021/0083452 A1 Mar. 18, 2021

(30) Foreign Application Priority Data

Sep. 18, 2019 (JP) .................................. 2019-168975

(51) Int. Cl.
*H01S 5/04* (2006.01)
*G01S 7/481* (2006.01)
(Continued)

(52) U.S. Cl.
CPC ........ *H01S 5/04257* (2019.08); *G01S 7/4815* (2013.01); *H01S 5/0234* (2021.01);
(Continued)

(58) Field of Classification Search
None
See application file for complete search history.

(56) References Cited

U.S. PATENT DOCUMENTS

| 4,797,890 A | * | 1/1989 | Inaba | ...................... H01L 33/20 |
| | | | | 313/499 |
| 10,189,050 B2 | * | 1/2019 | Torashima | ............. H02N 1/006 |

(Continued)

FOREIGN PATENT DOCUMENTS

| JP | H07-283486 A | 10/1995 |
| JP | 11-068230 | 3/1999 |

(Continued)

OTHER PUBLICATIONS

Office Action issued Apr. 11, 2023 in Japanese Patent Application No. 2019-168975 with computer-generated English Translation thereof, 12 pages.

(Continued)

*Primary Examiner* — Hovhannes Baghdasaryan
(74) *Attorney, Agent, or Firm* — XSENSUS LLP

(57) ABSTRACT

A surface emitting laser includes a substrate, a plurality of surface emitting laser elements on a first surface of the substrate, a first electrode electrically connected to a first conductive semiconductor of the surface emitting laser elements; and a second electrode electrically connected to a second conductive semiconductor of the surface emitting laser elements. Each of the surface emitting laser elements includes a first reflecting mirror on the substrate; an active layer on the first reflecting mirror; and a second reflecting mirror on the active layer. When a first contact region in which the first electrode and the first conductive semiconductor are connected to each other is on the first surface or in the first conductive semiconductor of the surface emitting laser elements. The first electrode is electrically connected to the light emitting units. The second electrode is electrically connected to each of the light emitting units.

20 Claims, 27 Drawing Sheets

(51) Int. Cl.
- *H01S 5/0234* (2021.01)
- *H01S 5/028* (2006.01)
- *H01S 5/042* (2006.01)
- *H01S 5/183* (2006.01)
- *H01S 5/343* (2006.01)
- *H01S 5/42* (2006.01)

(52) U.S. Cl.
CPC .......... *H01S 5/028* (2013.01); *H01S 5/18305* (2013.01); *H01S 5/18311* (2013.01); *H01S 5/18322* (2013.01); *H01S 5/18344* (2013.01); *H01S 5/18361* (2013.01); *H01S 5/3432* (2013.01); *H01S 5/34353* (2013.01); *H01S 5/423* (2013.01)

(56) References Cited

U.S. PATENT DOCUMENTS

| | | | |
|---|---|---|---|
| 10,605,915 B2* | 3/2020 | Kiyose | A61B 8/4281 |
| 2004/0174118 A1* | 9/2004 | Yukimoto | B41J 2/45 |
| | | | 313/512 |
| 2007/0241354 A1* | 10/2007 | Tanaka | H01S 5/04257 |
| | | | 257/E33.001 |
| 2008/0031295 A1 | 2/2008 | Tanaka | |
| 2011/0123227 A1 | 5/2011 | Hanaoka | |
| 2011/0316961 A1 | 12/2011 | Hanaoka | |
| 2013/0070039 A1 | 3/2013 | Harasaka et al. | |
| 2013/0251408 A1 | 9/2013 | Hanaoka et al. | |
| 2014/0219683 A1 | 8/2014 | Harasaka et al. | |
| 2017/0271851 A1 | 9/2017 | Hanaoka | |
| 2019/0305787 A1* | 10/2019 | Hagino | H03L 7/26 |

FOREIGN PATENT DOCUMENTS

| | | |
|---|---|---|
| JP | 2004-063657 A | 2/2004 |
| JP | 2005-303080 A | 10/2005 |
| JP | 2008-243836 | 10/2008 |
| JP | 2011-114146 A | 6/2011 |
| JP | 2017-212270 A | 11/2017 |
| JP | 2019-067831 A | 4/2019 |
| JP | 2020-123710 | 8/2020 |

OTHER PUBLICATIONS

M. Orenstei et al., "Matrix addressable vertical cavity surface emitting laser array" Electronics Letters Feb. 28, 1991 vol. 27 No. 5, p. 437-438.

* cited by examiner

SURFACE EMITTING LASER, SURFACE EMITTING LASER DEVICE, LIGHT SOURCE DEVICE, AND DETECTION APPARATUS

CROSS-REFERENCE TO RELATED APPLICATIONS

This patent application is based on and claims priority pursuant to 35 U.S.C. § 119(a) to Japanese Patent Application No. 2019-168975, filed on Sep. 18, 2019, in the Japan Patent Office, the entire disclosure of which is incorporated by reference herein.

BACKGROUND

Technical Field

The present disclosure relates to a surface emitting laser, a surface emitting laser device, a light source device, and a detection apparatus.

Related Art

A vertical cavity surface emitting laser (VCSEL) is a semiconductor laser that oscillates laser light in a direction perpendicular to a substrate. Surface emitting lasers include a front-emitting surface emitting laser that emits laser light toward a side on which an active layer of a substrate is provided, and a back-emitting surface emitting laser that emits laser light toward a side opposite to the side on which the active layer of the substrate is provided. There is a surface emitting laser in which a mesa portion is provided in a surface emitting laser element, a p-side contact electrode is formed on an upper surface of the mesa portion, and an n-side contact electrode is formed adjacent to the mesa portion.

Such a surface emitting laser has difficulties in improving the degree of integration of surface emitting laser elements.

BRIEF SUMMARY

In one aspect of this disclosure, there is described a surface emitting laser including a substrate, a plurality of surface emitting laser elements on a first surface of the substrate, a first electrode electrically connected to a first conductive semiconductor of the surface emitting laser elements; and a second electrode electrically connected to a second conductive semiconductor of the surface emitting laser elements. Each of the surface emitting laser elements includes a first reflecting mirror on the substrate; an active layer on the first reflecting mirror; and a second reflecting mirror on the active layer. When a first contact region in which the first electrode and the first conductive semiconductor are connected to each other is located on the first surface or in the first conductive semiconductor of the surface emitting laser elements. One, or two or more of the plurality of surface emitting laser elements are defined as a light emitting unit. The light emitting unit includes a plurality of light emitting units, and the first electrode is electrically connected to the plurality of light emitting units. The second electrode is electrically connected to each of the light emitting units.

BRIEF DESCRIPTION OF THE DRAWINGS

The aforementioned and other aspects, features, and advantages of the present disclosure would be better understood by reference to the following detailed description when considered in connection with the accompanying drawings, wherein.

Figure 1:
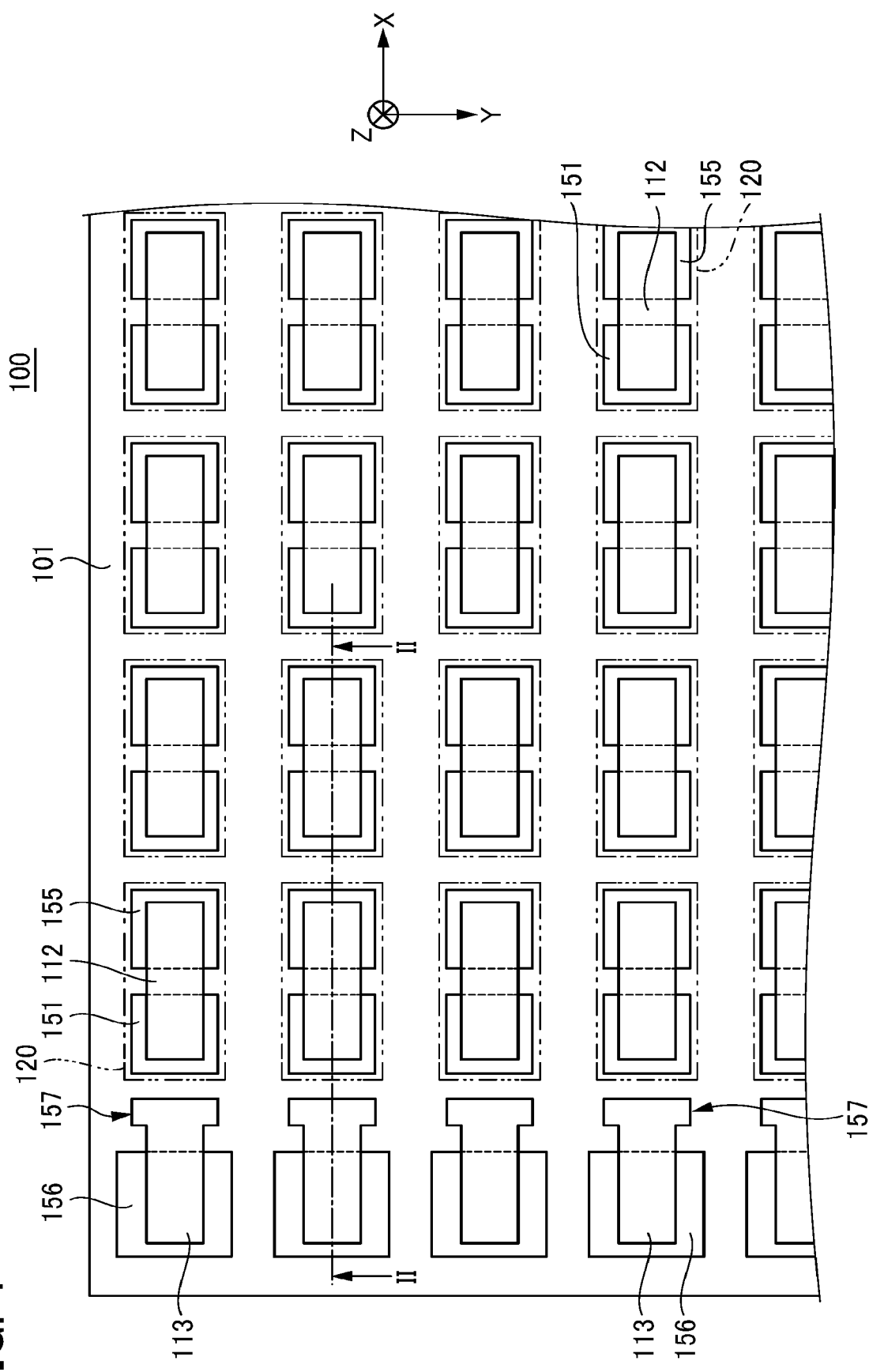
FIG. 1 is a schematic view illustrating an overview of a layout of a surface emitting laser according to a first embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION OF EMBODIMENTS

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, embodiments of the present disclosure will be described with reference to the accompanying drawings. Note that, in the specification and the drawings, components having substantially the same functional configuration are denoted by the same reference sign, and redundant description may be omitted. In the following description, a laser oscillation direction (an emission direction of laser light) is defined as a Z-axis direction, and two directions orthogonal to each other in a plane perpendicular to the Z-axis direction are defined as an X-axis direction and a Y-axis direction in the right-hand system. In addition, a positive Z-axis direction is defined as a downward direction. In the present disclosure, a plan view refers to a view in the Z-axis direction, that is, in a direction perpendicular to a substrate. However, the surface emitting laser element or the like may be used in an upside down state, and may be disposed at a desirable angle.

The embodiments of the present disclosure improve the degree of integration of the surface emitting laser elements.

A first embodiment is described. The first embodiment relates to a surface emitting laser including a back-emitting surface emitting laser element.

Figure 2:
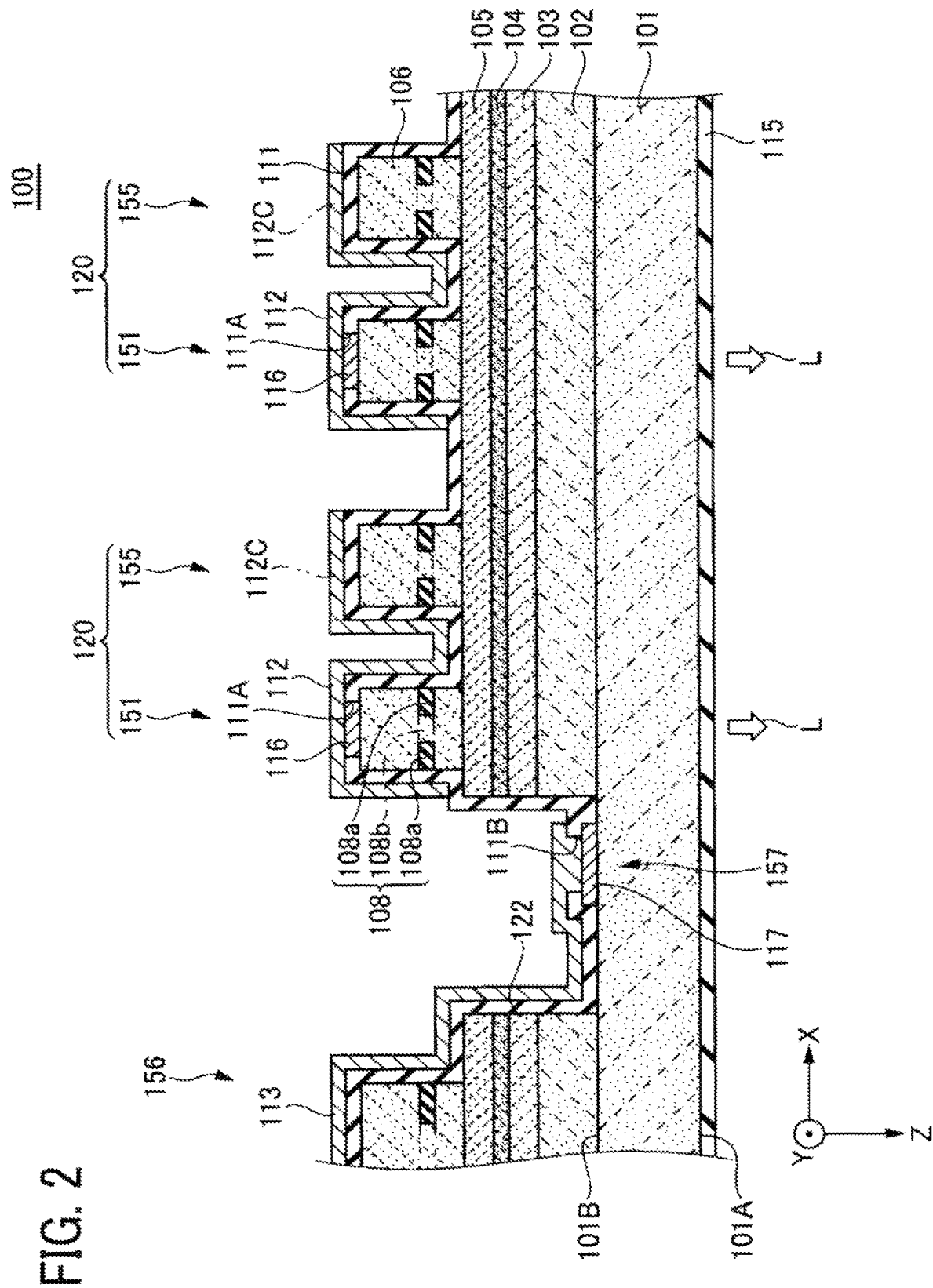
FIG. 2 is a cross-sectional view illustrating an internal structure of the surface emitting laser according to the first embodiment.

FIG. 1 is a schematic view illustrating an overview of a layout of the surface emitting laser according to the first embodiment. FIG. 2 is a cross-sectional view illustrating an internal structure of the surface emitting laser according to the first embodiment. FIG. 2 corresponds to a cross-sectional view taken along line II-II in FIG. 1.

As illustrated in FIG. 1, a surface emitting laser 100 according to the first embodiment includes a plurality of surface emitting laser elements 151. The number of the surface emitting laser elements 151 is not limited. As illustrated in FIG. 2, the surface emitting laser elements 151 each emit laser light L toward a back surface 101A side of a substrate 101. The surface emitting laser elements 151 are arranged in the X-axis direction and the Y-axis direction. The X-axis direction is an example of a first direction, and the Y-axis direction is an example of a second direction. Note that the surface emitting laser elements 151 are not limited to being two-dimensionally arranged, and, for example, may be one-dimensionally arranged in the X-axis direction. In addition, the surface emitting laser elements 151 are not limited to being regularly arranged, and may be randomly arranged.

A p-side mesa post region 155 is provided in the vicinity of each of the surface emitting laser elements 151. The p-side mesa post region 155 is provided on the substrate 101 to be spaced apart from the surface emitting laser element 151. For example, a p-side electrode 112 is provided to overlap the surface emitting laser element 151 and the p-side mesa post region 155 adjacent to the surface emitting laser element 151 on the +X side in plan view. A set of the surface emitting laser element 151 and the p-side mesa post region 155 overlapping the p-side electrode 112 in plan view is included in a light emitting unit 120. Although details will be described later, the p-side electrode 112 is connected to a p-side electrode of a mount substrate in a region overlapping the p-side mesa post region 155 in plan view. Light emitting units 120 are arranged in the X-axis direction and the Y-axis direction. The p-side electrode 112 is an example of a second electrode, and the p-side mesa post region 155 is an example of a second mesa post region. A portion 112C of the p-side electrode 112 in a region overlapping the p-side mesa post region 155 in plan view is an example of a second connection portion (see FIG. 3).

An n-side mesa post region 156 is provided outside a group of a plurality of light emitting units 120 arranged in the X-axis direction and on a side of the group of the light emitting units 120. The n-side mesa post region 156 is provided on the substrate 101 to be spaced apart from the plurality of light emitting units 120. An n-side electrode 113 overlapping the n-side mesa post region 156 in plan view is provided. An n-side contact region 157 in which the n-side electrode 113 is electrically connected to the substrate 101 is provided between the group of the light emitting units 120 and the n-side mesa post region 156. Although details will be described later, the n-side electrode 113 is connected to an n-side electrode of the mount substrate in a region overlapping the n-side mesa post region 156 in plan view. For example, the n-side mesa post region 156 is located outside an end portion on the −X side of the group of the plurality of light emitting units 120 arranged in the X-axis direction. For example, n-side contact regions 157 are arranged in the Y-axis direction, and a plurality of n-side mesa post regions 156 are arranged in the Y-axis direction. The n-side electrode 113 is an example of a first electrode, the n-side mesa post regions 156 are each an example of a first mesa post region, and the n-side contact regions 157 are each an example of a first contact region. A portion 113C of the n-side electrode 113 in a region overlapping the n-side mesa post region 156 in plan view is an example of a first connection portion (see FIG. 3).

The surface emitting laser 100 is a surface emitting laser having an oscillation wavelength of 940 nm band. As illustrated in FIG. 2, the surface emitting laser 100 includes the substrate 101, a lower semiconductor multilayer film reflecting mirror 102, a lower spacer layer 103, an active layer 104, an upper spacer layer 105, an upper semiconductor multilayer film reflecting mirror 106, an insulating film 111, a p-side contact layer 116, an n-side contact layer 117, the p-side electrode 112, the n-side electrode 113, and an anti-reflection film 115. The lower semiconductor multilayer film reflecting mirror 102 is an example of a first reflecting mirror, and the upper semiconductor multilayer film reflecting mirror 106 is an example of a second reflecting mirror.

As an example, the substrate 101 is an n-GaAs single-crystal semiconductor (a first semiconductor) substrate in which the normal direction of a mirror-polished surface of a surface (principal surface) is inclined by 15 degrees ($\theta=15$ degrees) in a direction of a crystal orientation A direction with respect to a crystal orientation direction. In other words, the substrate 101 is so-called inclined substrate. Note that the substrate is not limited to the one described above.

The lower semiconductor multilayer film reflecting mirror 102 is stacked on the −Z side (upper side) of the substrate 101 via a buffer layer, and has about 26 pairs of a low refractive-index layer made of $n$-$Al_{0.9}Ga_{0.1}As$ and a high refractive-index layer made of $n$-$Al_{0.1}Ga_{0.9}As$. A composition-graded layer having a thickness of 20 nm in which the composition gradually changes from one composition to the other composition is provided between the respective refractive-index layers to reduce the electrical resistance between the respective refractive-index layers. Each of the refractive-index layers includes ½ of the adjacent composition-graded layer, and is set to have an optical thickness of $\lambda/4$, where $\lambda$ denotes an oscillation wavelength. Note that when the optical thickness is $\lambda/4$, the actual thickness of the layer is $D=\lambda/4n$ (where n denotes a refractive index of a medium of that layer). For example, the reflectivity of the lower semiconductor multilayer film reflecting mirror 102 is about 99.6%.

The lower spacer layer 103 is a layer that is stacked on the −Z side (upper side) of the lower semiconductor multilayer film reflecting mirror 102 and is made of non-doped $Al_{0.15}Ga_{0.85}As$. The material of the lower spacer layer 103 is not limited to non-doped $Al_{0.15}Ga_{0.85}As$, and may be, for example, non-doped AlGaInP.

The active layer 104 is an active layer that is stacked on the −Z side (upper side) of the lower spacer layer 103 and has a structure of a multi-quantum well (MQW) including a plurality of quantum well layers and a plurality of barrier layers. The quantum well layers are made of InGaAs, and each barrier layer is made of AlGaAs.

The upper spacer layer 105 is a layer that is stacked on the −Z side (upper side) of the active layer 104 and is made of non-doped $Al_{0.15}Ga_{0.85}As$. Like the lower spacer layer 103, the material of the upper spacer layer 105 is not limited to non-doped $Al_{0.15}Ga_{0.85}As$, and may be, for example, non-doped AlGaInP.

The portion constituted of the lower spacer layer 103, the active layer 104, and the upper spacer layer 105 is also referred to as a resonator structure, and the thickness thereof is set to be an optical thickness corresponding to one wavelength. Note that the active layer 104 is provided at the center of the resonator structure, which is a position corresponding to the antinode in the standing wave distribution of the electric field, so as to obtain a high induced emission probability. It is desirable that the thicknesses of the respective layers of the lower spacer layer 103, the active layer 104, and the upper spacer layer 105 are set so that single longitudinal mode oscillation is obtained in 940 nm, which is the oscillation wavelength. Moreover, it is desirable that the relative relationship (detuning) between the resonance wavelength and the emission wavelength (composition) of the active layer 104 is adjusted so that the oscillation threshold current of the surface emitting laser element 151 becomes the smallest at room temperature.

The upper semiconductor multilayer film reflecting mirror 106 is stacked on the −Z side (upper side) of the upper spacer layer 105, and has about 30 pairs of a low refractive-index layer made of $p$-$Al_{0.9}Ga_{0.1}As$ and a high-refractive index layer made of $p$-$Al_{0.1}Ga_{0.9}As$. A composition-graded layer in which the composition gradually changes from one composition to the other composition is provided between the respective refractive-index layers to reduce the electrical resistance between the respective refractive-index layers. Each of the refractive-index layers includes ½ of the adjacent composition-graded layer, and is set to have an optical length of $\lambda/4$ where $\lambda$ denotes the oscillation wavelength. The reflectivity of the upper semiconductor multilayer film reflecting mirror 106 is higher than the reflectivity of the lower semiconductor multilayer film reflecting mirror 102, and is, for example, about 99.9%. A GaAs layer doped with the p-type dopant, which has a thickness of approximately 20 nm, formed on the uppermost layer of the upper semiconductor multilayer film reflecting mirror 106 is an example of a second conductive semiconductor.

In one of the low refractive index layers of the upper semiconductor multilayer film reflecting mirror 106, a selective oxidization layer 108 made of $p$-$Al_{0.98}Ga_{0.02}As$ is inserted to have a thickness of about 30 nm. The insertion position of the selective oxidization layer 108 is, for example, a position corresponding to the second node from the active layer 104 in the standing wave distribution of the electric field. The selective oxidization layer 108 includes a non-oxidized region 108b and an oxidized region 108a around the non-oxidized region 108b.

The anti-reflection film 115 is formed on the +Z side (lower side) surface (back surface 101A) of the substrate 101. The anti-reflection film 115 is a non-reflective coating film with respect to 940 nm which is the oscillation wavelength.

The p-side contact layer 116 is stacked on the −Z side (upper side) of the upper semiconductor multilayer film reflecting mirror 106 in the surface emitting laser element 151, and includes, for example, a gold-zinc alloy (AuZn) layer or a titanium (Ti) layer. The p-side contact layer 116 is in ohmic contact with the upper semiconductor multilayer film reflecting mirror 106.

The n-side contact layer 117 is stacked on the −Z side (upper side) of the substrate 101 in the n-side contact region 157, and includes, for example, a gold-germanium alloy (AuGe) layer. The n-side contact layer 117 is in ohmic contact with the substrate 101.

In the surface emitting laser element 151, as illustrated in FIG. 2, the upper semiconductor multilayer film reflecting mirror 106 has a mesa structure. The non-oxidized region 108b is located at the center of the mesa structure in plan view. In the surface emitting laser element 151, the insulating film 111 covers the upper semiconductor multilayer film reflecting mirror 106 and the upper spacer layer 105. The insulating film 111 is, for example, a silicon nitride (SiN) film. An opening 111A is formed in the insulating film 111 to expose a portion of the upper surface of the p-side contact layer 116 in the surface emitting laser element 151. In plan view, the non-oxidized region 108b is located inside the opening 111A. The p-side electrode 112 is formed on the insulating film 111. The p-side electrode 112 is in contact with the upper surface of the upper semiconductor multilayer film reflecting mirror 106 inside the opening 111A. The p-side electrode 112 includes, for example, a gold (Au) film.

In the p-side mesa post region 155, as illustrated in FIG. 2, the upper semiconductor multilayer film reflecting mirror 106 has a mesa structure. The non-oxidized region 108b is located at the center of the mesa structure in plan view. The p-side electrode 112 extends from the surface emitting laser element 151 to the −Z side (upper side) of the upper semiconductor multilayer film reflecting mirror 106 in the p-side mesa post region 155 in the light emitting unit 120. In the p-side mesa post region 155, the p-side electrode 112 is electrically insulated from the upper semiconductor multilayer film reflecting mirror 106 by the insulating film 111. The p-side electrode 112 is connected to the p-side electrode of the mount substrate such as a driver IC or a submount in a region overlapping the p-side mesa post region 155 in plan view by flip-chip mounting. That is, the portion 112C connected to the p-side electrode of the mount substrate is in a region overlapping the p-side mesa post region 155 in plan view.

A groove 122 is formed in the upper spacer layer 105, the active layer 104, the lower spacer layer 103, and the lower semiconductor multilayer film reflecting mirror 102 between the group of the plurality of light emitting units 120 arranged in the X-axis direction and the n-side mesa post region 156 adjacent to the group of the light emitting units 120 in the X-axis direction. The groove 122 may reach a surface layer portion of the substrate 101. For example, the groove 122 extends in the Y-axis direction. At the bottom of the groove 122, the n-side contact layer 117 is stacked on the −Z side (upper side) of the substrate 101. The insulating film 111 covers the side surfaces of the upper spacer layer 105, the active layer 104, the lower spacer layer 103, the lower semiconductor multilayer film reflecting mirror 102, and the n-side contact layer 117, and the upper surfaces of the substrate 101 and the n-side contact layer 117 inside the groove 122. An opening 111B is formed in the insulating film 111 to expose a portion of the upper surface of the n-side contact layer 117.

In the n-side mesa post region 156, as illustrated in FIG. 2, the upper semiconductor multilayer film reflecting mirror 106 has a mesa structure. The non-oxidized region 108b is located at the center of the mesa structure in plan view. In the n-side mesa post region 156, the insulating film 111 covers the upper semiconductor multilayer film reflecting mirror 106 and the upper spacer layer 105. The n-side electrode 113 is formed on the insulating film 111. The n-side electrode 113 extends to the inside of the groove 122 along the upper surface of the insulating film 111, and is in contact with the upper surface of the n-side contact layer 117 inside the opening 111B. The n-side electrode 113 includes, for example, a gold (Au) film. The n-side electrode 113 is connected to the n-side electrode of the mount substrate such as a driver IC or a submount in a region overlapping the n-side mesa post region 156 in plan view by flip-chip mounting. That is, the portion 113C connected to the n-side electrode of the mount substrate is in a region overlapping the n-side mesa post region 156 in plan view.

Figure 3:
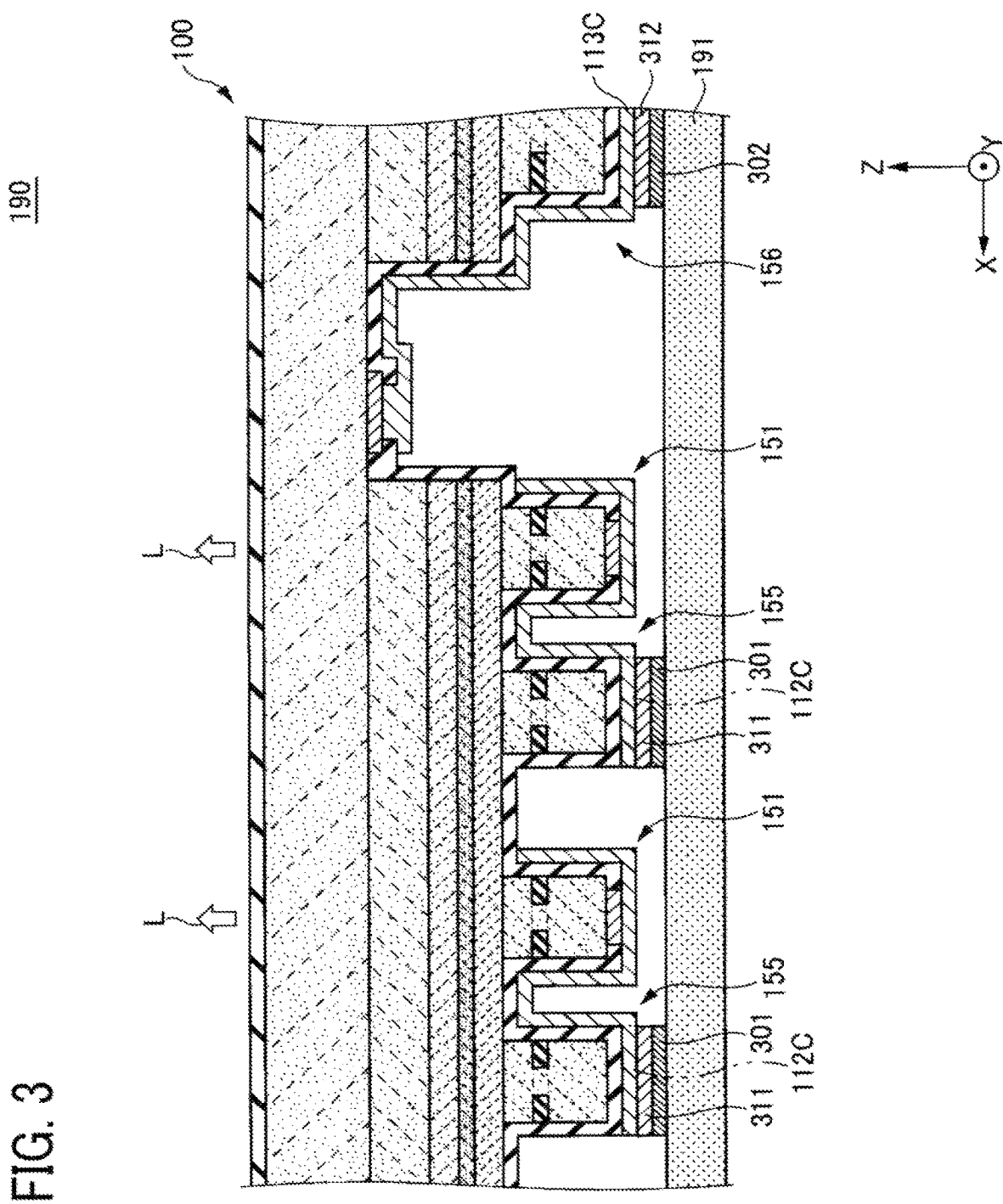
FIG. 3 is a schematic view illustrating an example of use of the surface emitting laser according to the first embodiment.

The surface emitting laser 100 is mounted on the mount substrate such as a submount and is used. FIG. 3 is a schematic view illustrating an example of use of the surface emitting laser 100. The mount substrate and the surface emitting laser 100 mounted on the mount substrate are included in a surface emitting laser device 190.

In this example of use, as illustrated in FIG. 3, the surface emitting laser 100 is mounted on a driver IC 191 by flip-chip mounting. The p-side electrode 112 is electrically connected to a p-side electrode 301 provided on the driver IC 191 via a conductive material 311 in the p-side mesa post region 155. The n-side electrode 113 is electrically connected to an n-side electrode 302 provided on the driver IC 191 via a conductive material 312 in the n-side mesa post region 156. The conductive materials 311 and 312 may contain, for example, solder. The surface emitting laser 100 is driven by the driver IC 191. For example, a common potential is applied to the n-side electrode 113, and an individual potential is applied to the p-side electrode 112. The potential applied to the n-side electrode 113 is transmitted to the lower semiconductor multilayer film reflecting mirror 102 via the n-side contact layer 117 and the substrate 101. The potential applied to the p-side electrode 112 is transmitted to the upper semiconductor multilayer film reflecting mirror 106 via the p-side contact layer 116. Then, the laser light L corresponding to the potential difference between the lower semiconductor multilayer film reflecting mirror 102 and the upper semiconductor multilayer film reflecting mirror 106 is emitted from the active layer 104, and is emitted from the back surface 101A to the outside. The driver IC 191 is an example of a mount substrate.

When the flip-chip mounting is performed, a compressive stress may act on the p-side mesa post region 155 and the n-side mesa post region 156. However, even when the compressive stress acts on the p-side mesa post region 155 and the n-side mesa post region 156, the compressive stress hardly acts on the surface emitting laser element 151. Thus, a variation in the characteristics associated with the compressive stress is less likely to occur, and stable characteristics can be obtained.

The object on which the surface emitting laser 100 is mounted is not limited to the driver IC 191. For example, the surface emitting laser 100 may be mounted on a submount.

An interposer may be used for mounting of the surface emitting laser 100 on the mount substrate. Further, the p-side electrode 112 may be directly connected to the p-side electrode 301, and the n-side electrode 113 may be directly connected to the n-side electrode 302.

Figure 4:
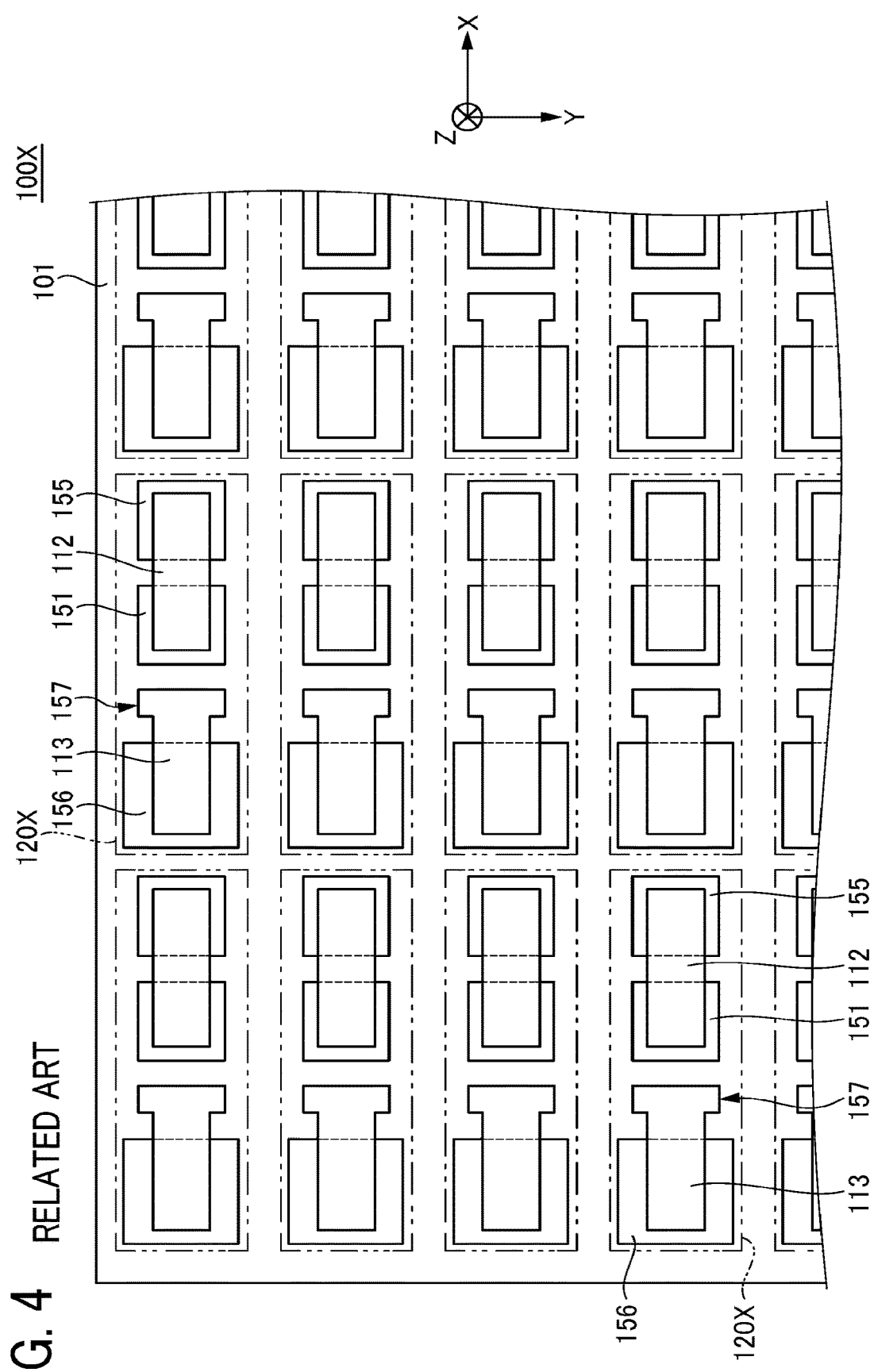
FIG. 4 is a schematic view illustrating an overview of a layout of a surface emitting laser according to a reference example.

The operation and effect of the surface emitting laser 100 will be described in comparison with a surface emitting laser according to a reference example. FIG. 4 is a schematic view illustrating an overview of a layout of the surface emitting laser according to the reference example.

As illustrated in FIG. 4, a surface emitting laser 100X according to the reference example includes a plurality of surface emitting laser elements 151. The surface emitting laser elements 151 are arranged in the X-axis direction and the Y-axis direction.

A p-side mesa post region 155 and an n-side mesa post region 156 are provided in the vicinity of each of the surface emitting laser elements 151. The surface emitting laser element 151, the p-side mesa post region 155 adjacent to the surface emitting laser element 151 on the +X side, and the n-side mesa post region 156 adjacent to the surface emitting laser element 151 on the −X side are included in a light emitting unit 120X. Light emitting units 120X are arranged in the X-axis direction and the Y-axis direction. The other configurations are similar to those in the first embodiment.

When the sizes of the surface emitting laser element 151, the p-side mesa post region 155, and the n-side mesa post region 156 of the surface emitting laser 100 are equal to those of the surface emitting laser 100X in plan view, the size of the light emitting unit 120X is larger than the size of the light emitting unit 120 by the amount of the n-side mesa post region 156. Thus, the light emitting unit 120 may integrate the surface emitting laser elements 151 at a higher density than that of the light emitting unit 120X. That is, according to the surface emitting laser 100, the degree of integration of the surface emitting laser elements 151 can be higher than that of surface emitting laser 100X.

A method for manufacturing the surface emitting laser 100 will be described. Note that a structure in which a plurality of semiconductor layers are stacked on the substrate 101 as described above is also referred to as a "stacked body" in the following description. FIGS. 5 to 11 are cross-sectional views illustrating a method for manufacturing the surface emitting laser 100 according to the first embodiment.

Figure 5:
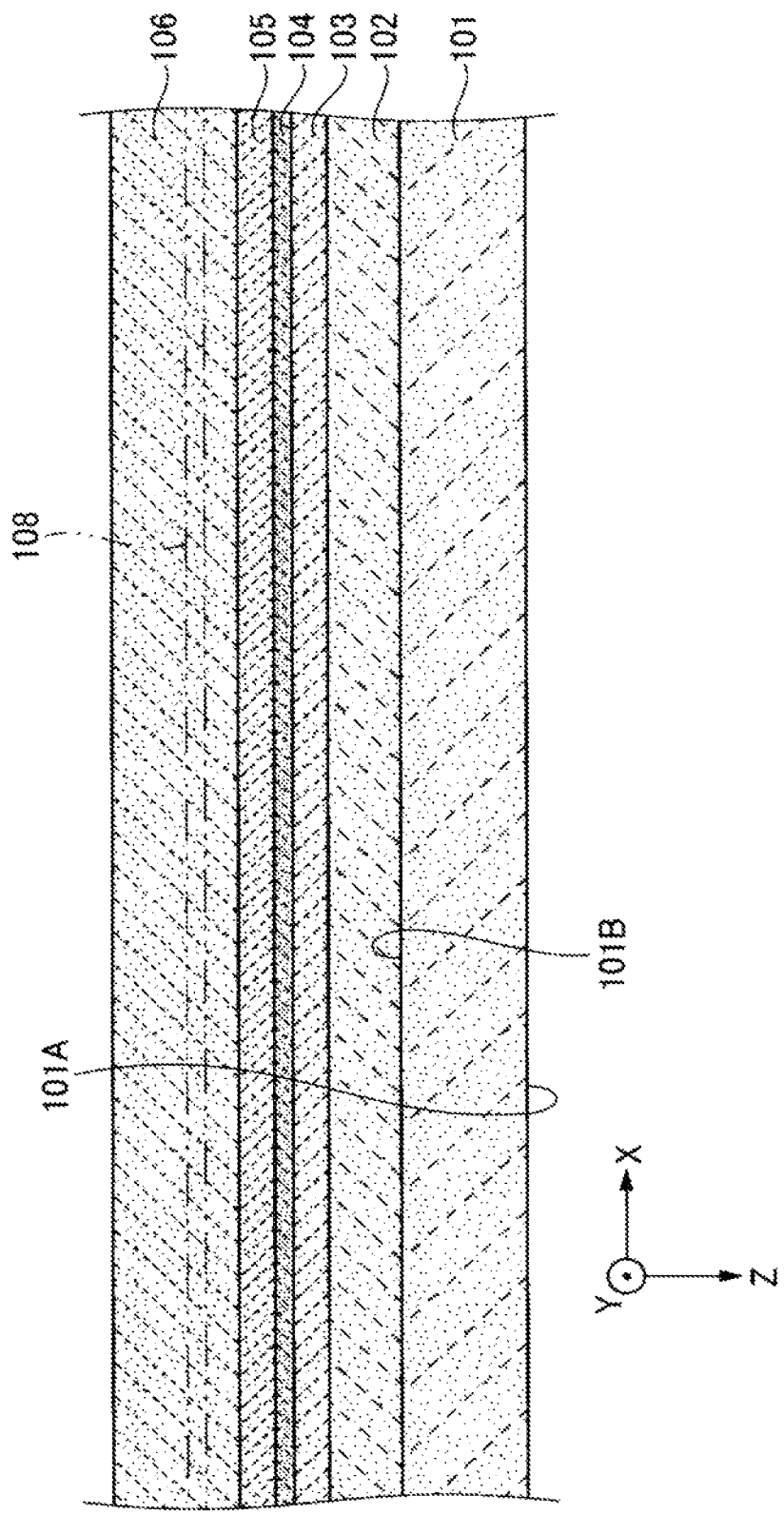
FIG. 5 is a cross-sectional view (first view) illustrating a method for manufacturing the surface emitting laser according to the first embodiment.

First, as illustrated in FIG. 5, the stacked body is formed by crystal growth by a metal organic chemical vapor deposition (MOCVD) method or a molecular beam epitaxy (MBE) method.

In the case of the MOCVD method, trimethyl aluminum (TMA), trimethyl gallium (TMG), or trimethyl indium (TMI) is used as the raw material of the group III; and phosphine ($PH_3$) or arsine ($AsH_3$) is used as the raw material of the group V. Carbon tetrabromide ($CBr_4$) or dimethyl zinc (DMZn) is used as the raw material of the p-type dopant; and hydrogen selenide ($H_2Se$) is used as the raw material of the n-type dopant.

Figure 6:
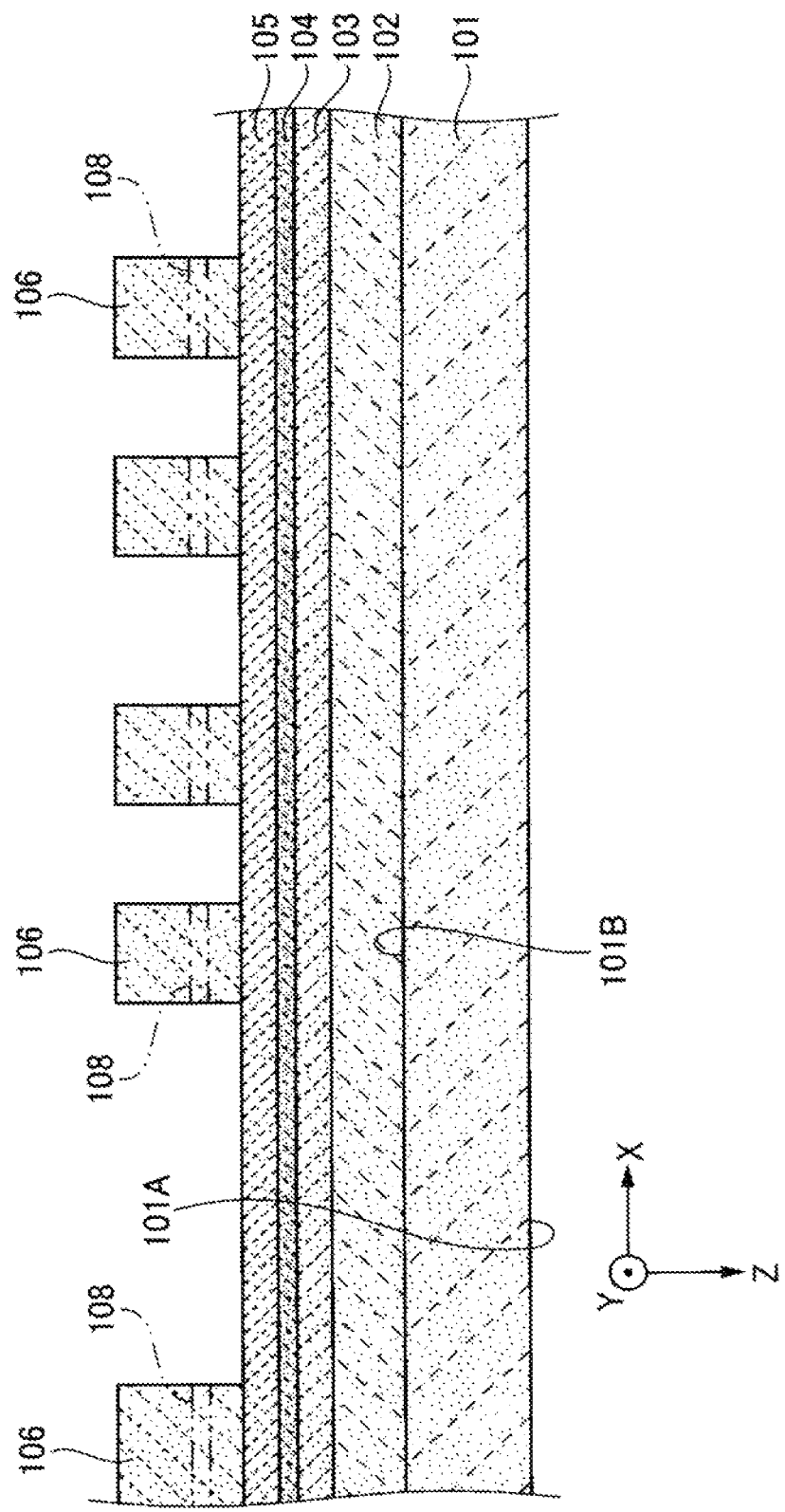
FIG. 6 is a cross-sectional view (second view) illustrating the method for manufacturing the surface emitting laser according to the first embodiment.

Next, as illustrated in FIG. 6, the upper semiconductor multilayer film reflecting mirror 106 including the selective oxidization layer 108 is etched, so that the mesa structure is formed in the upper semiconductor multilayer film reflecting mirror 106 in a region corresponding to the surface emitting laser element 151, a region corresponding to the p-side mesa post region 155, and a region corresponding to the n-side mesa post region 156. As the etching, for example, inductively coupled plasma (ICP) dry etching, electron cyclotron resonance (ECR) dry etching, or the like, can be performed. In the present embodiment, etching is performed so that the etched bottom surface serves as the upper spacer layer 105. However, the position of the etched bottom surface may be appropriately selected, and the etched bottom surface may be, for example, the active layer 104, the lower spacer layer 103, the lower semiconductor multilayer film reflecting mirror 102, or the substrate 101.

Figure 7:
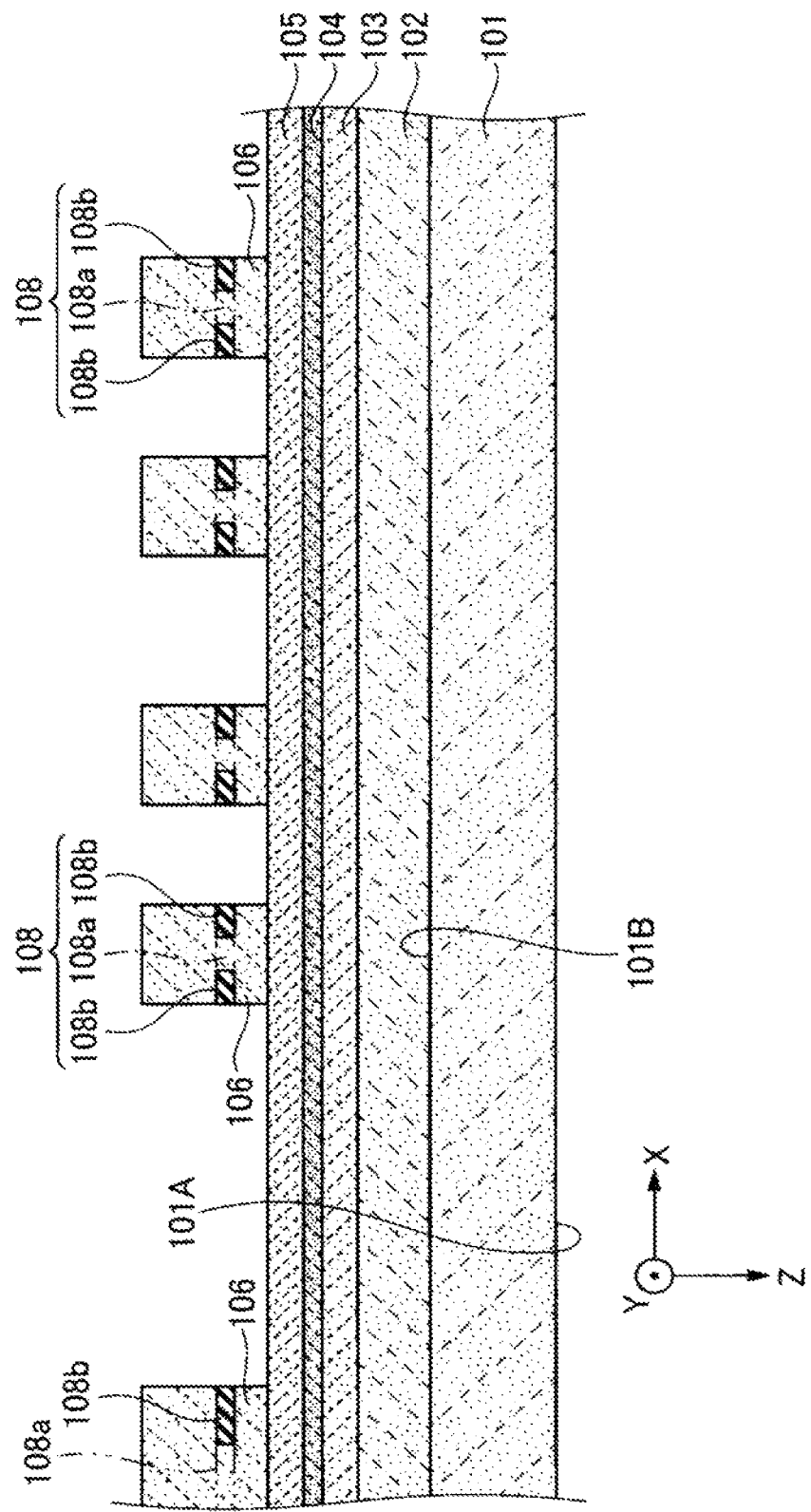
FIG. 7 is a cross-sectional view (third view) illustrating the method for manufacturing the surface emitting laser according to the first embodiment.

Thereafter, as illustrated in FIG. 7, the stacked body is subjected to heat treatment in water vapor. As a result, Al (aluminum) in the selective oxidization layer 108 is selectively oxidized from the outer peripheral portion of the mesa structure, and the non-oxidized region 108b surrounded by the oxidized region 108a of Al remains in the center portion of the mesa structure. That is, a so-called oxidized confinement structure is formed to restrict the path of the driving current of a light emitter to the center portion of the mesa structure. The non-oxidized region 108b is a current passing region.

Figure 8:
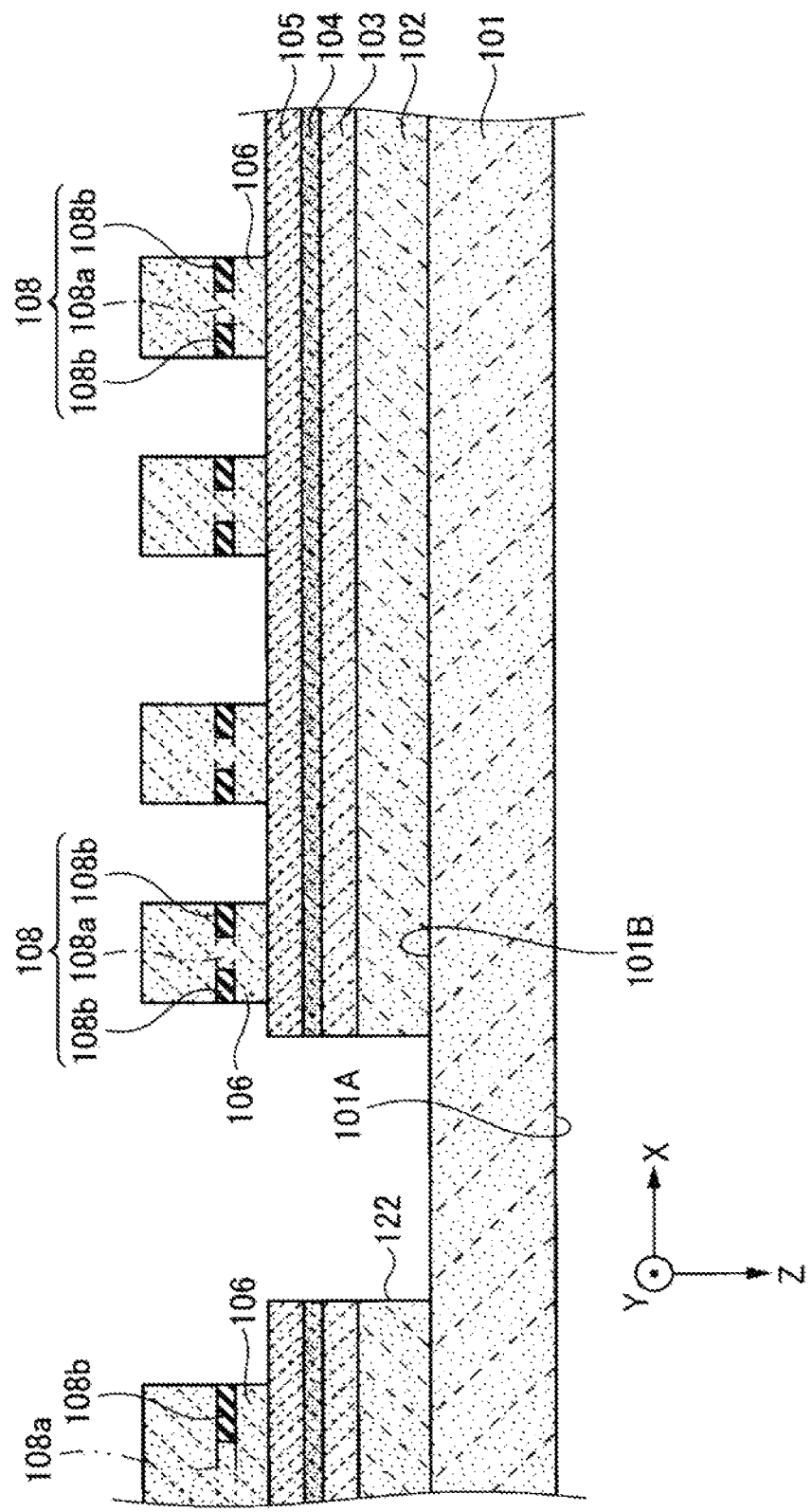
FIG. 8 is a cross-sectional view (fourth view) illustrating the method for manufacturing the surface emitting laser according to the first embodiment.

Next, as illustrated in FIG. 8, the upper spacer layer 105, the active layer 104, the lower spacer layer 103, and the lower semiconductor multilayer film reflecting mirror 102 are etched, so that the groove 122 is formed in the upper spacer layer 105, the active layer 104, the lower spacer layer 103, and the lower semiconductor multilayer film reflecting mirror 102 between a region corresponding to the light emitting unit 120 and a region corresponding to the n-side mesa post region 156 adjacent to the light emitting unit 120 in the X-axis direction. By performing the etching for forming the groove 122 after the selective oxidation of the selective oxidization layer 108, it is possible to prevent damage to the selective oxidization layer 108 before the selective oxidation.

Figure 9:
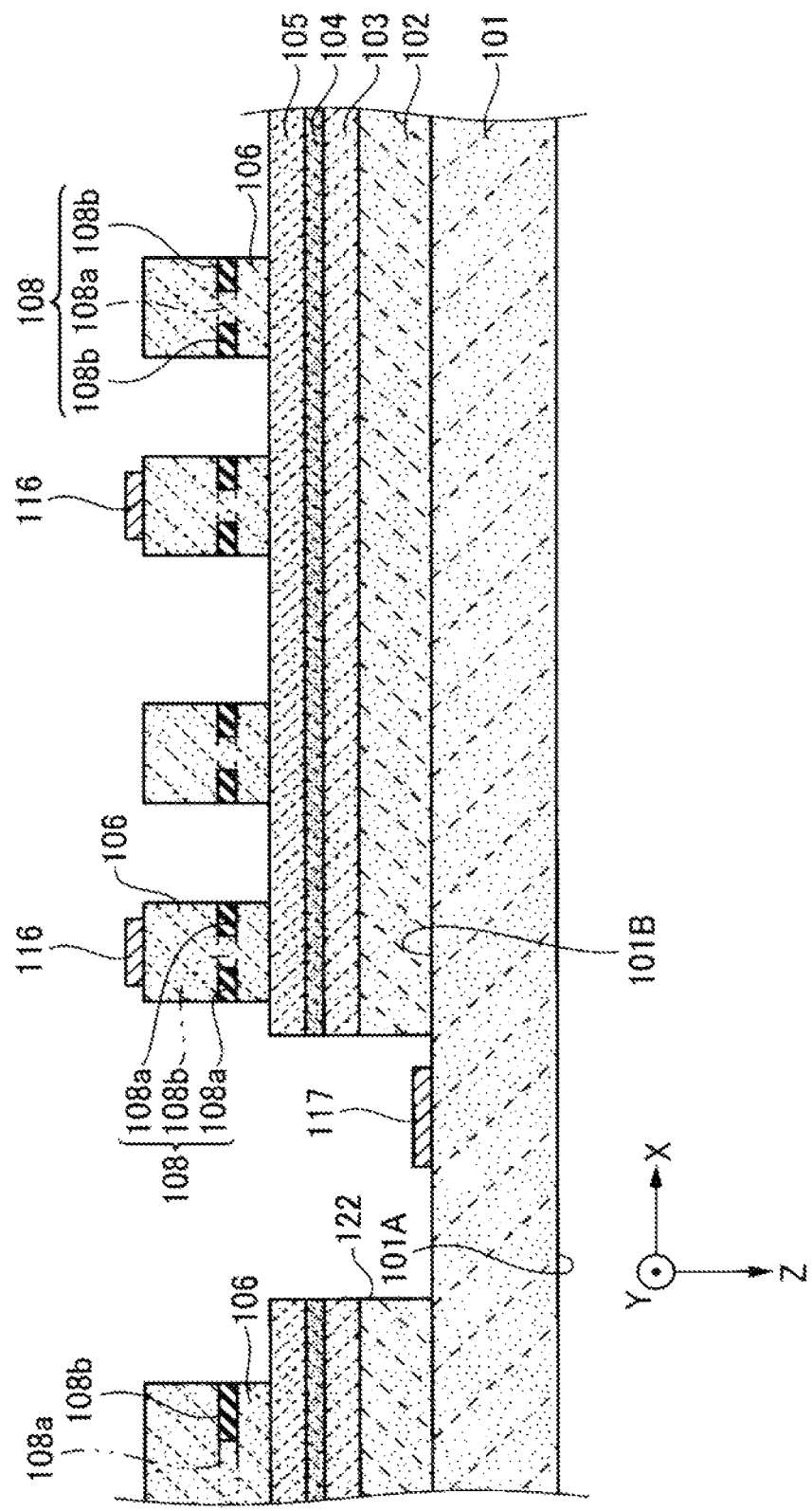
FIG. 9 is a cross-sectional view (fifth view) illustrating the method for manufacturing the surface emitting laser according to the first embodiment.

Then, as illustrated in FIG. 9, in a region corresponding to the surface emitting laser element 151, the p-side contact layer 116 is formed on the upper semiconductor multilayer film reflecting mirror 106, and the n-side contact layer 117 is formed on the substrate 101 at the bottom of the groove 122. The p-side contact layer 116 and the n-side contact layer 117 may be formed by, for example, a lift-off method. Either the p-side contact layer 116 or the n-side contact layer 117 may be formed first. After the p-side contact layer 116 and the n-side contact layer 117 are formed, heat treatment is performed in a reducing atmosphere or an inert atmosphere, and the p-side contact layer 116 and the upper semiconductor multilayer film reflecting mirror 106 are brought into ohmic contact with each other, so that the n-side contact layer 117 and the substrate 101 are brought into ohmic contact with each other.

Figure 10:
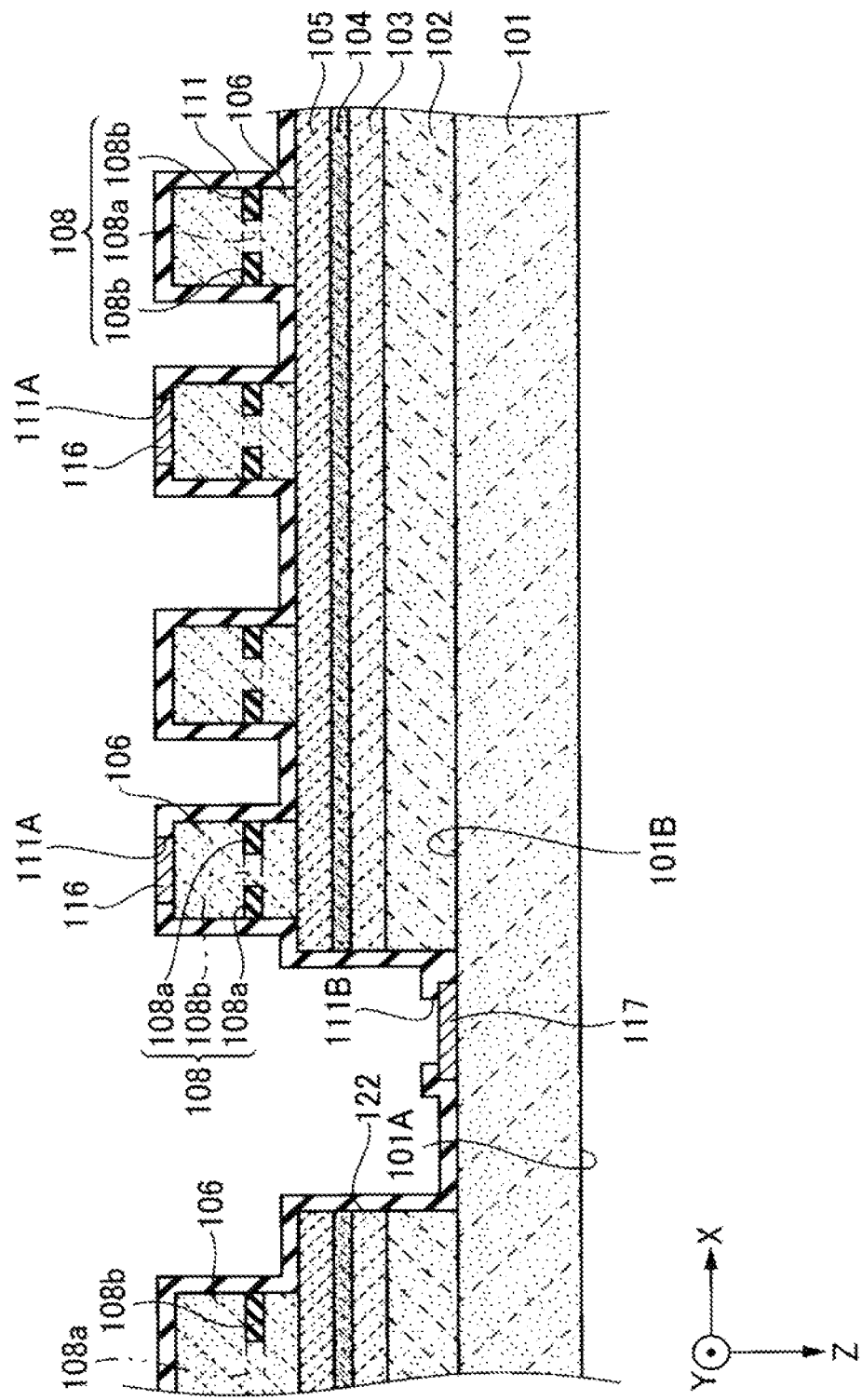
FIG. 10 is a cross-sectional view (sixth view) illustrating the method for manufacturing the surface emitting laser according to the first embodiment.

Then, as illustrated in FIG. 10, the insulating film 111 is formed on the entire surface on the front surface 101B side of the substrate 101. The insulating film 111 can be formed by, for example, a chemical vapor deposition (CVD) method. Subsequently, the openings 111A and 111B are formed in the insulating film 111. The openings 111A and 111B can be formed by wet etching using, for example, buffered hydrofluoric acid (BHF).

Figure 11:
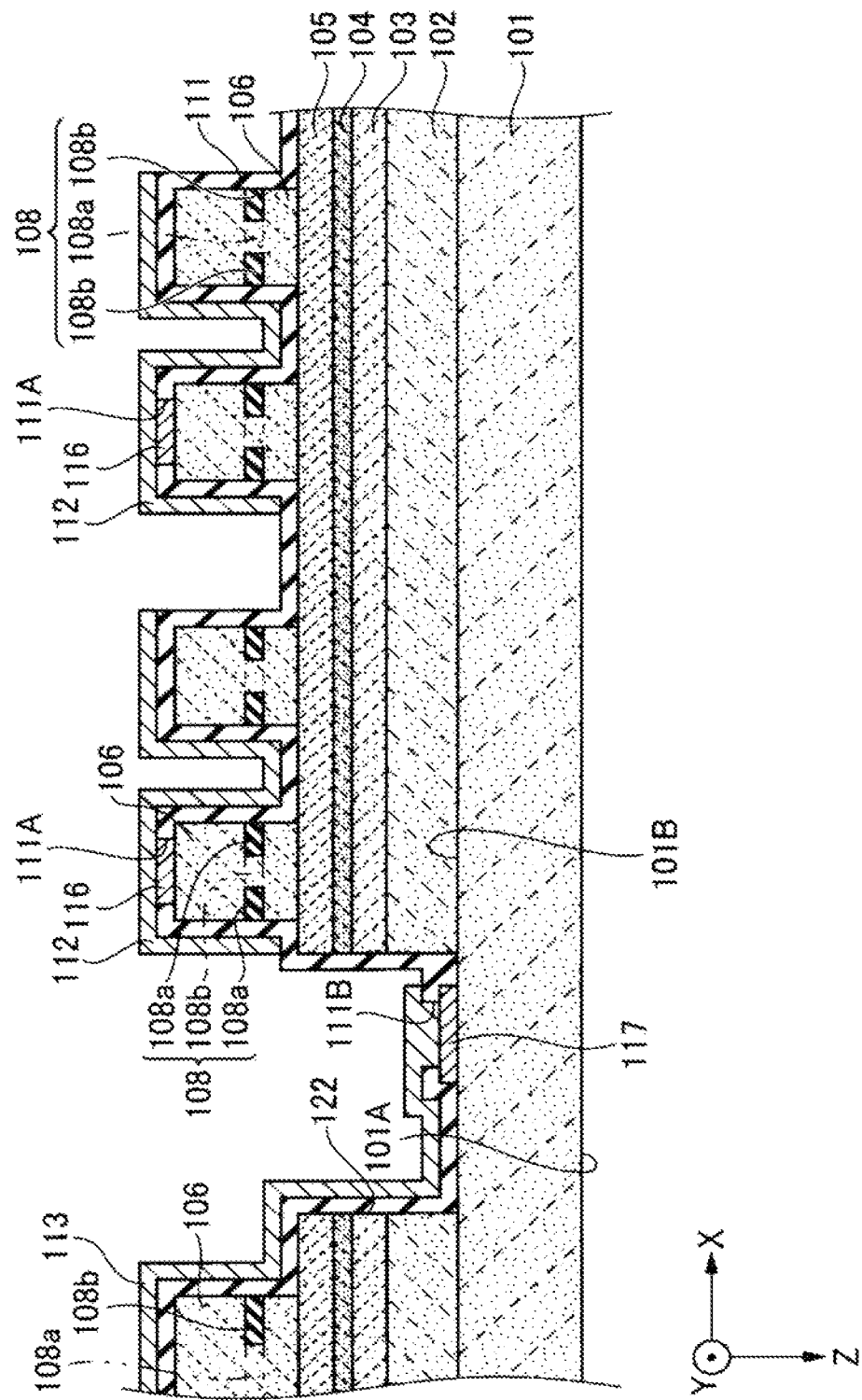
FIG. 11 is a cross-sectional view (seventh view) illustrating the method for manufacturing the surface emitting laser according to the first embodiment.

Next, as illustrated in FIG. 11, the p-side electrode 112 is formed in a region corresponding to the surface emitting laser element 151 and a region corresponding to the p-side mesa post region 155, and the n-side electrode 113 is formed in a region corresponding to the n-side mesa post region 156. The p-side electrode 112 and the n-side electrode 113 can be formed by, for example, a lift-off method. Either of the p-side electrode 112 and the n-side electrode 113 may be formed first.

Thereafter, the back surface 101A of the substrate 101 is polished and mirror-finished, and the anti-reflection film 115 is formed on the back surface 101A (see FIG. 2).

In this way, it is possible to manufacture the surface emitting laser 100.

Figure 12:
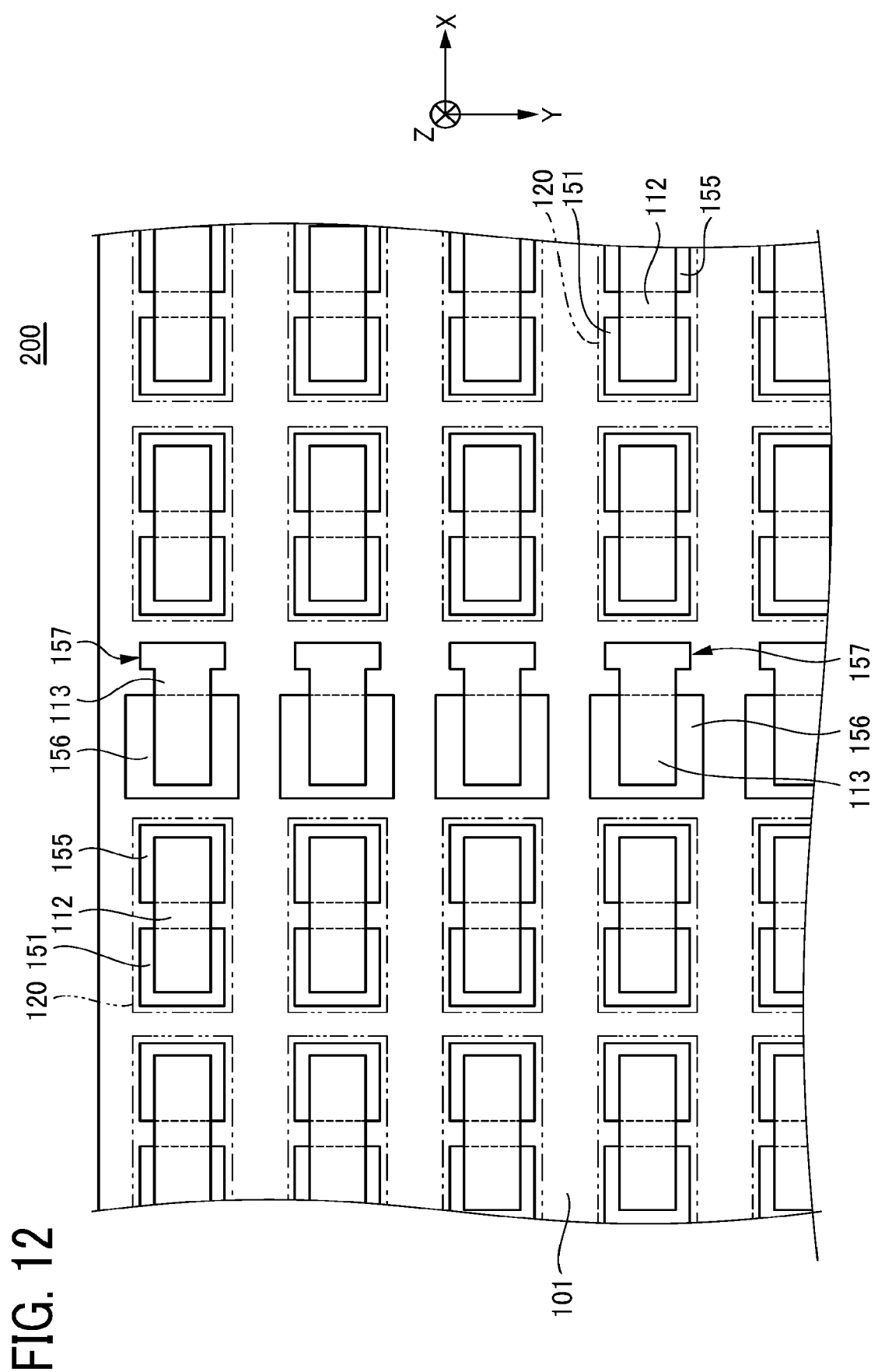
FIG. 12 is a schematic view illustrating an overview of a layout of a surface emitting laser according to a second embodiment.

Next, a second embodiment will be described. The second embodiment differs from the first embodiment mainly in terms of the arrangement of the n-side mesa post regions 156. FIG. 12 is a schematic view illustrating an overview of a layout of a surface emitting laser according to the second embodiment.

As illustrated in FIG. 12, in a surface emitting laser 200 according to the second embodiment, a plurality of n-side mesa post regions 156 are arranged in the Y-axis direction, and a plurality of light emitting units 120 are arranged in the X-axis direction on both the +X side and the −X side of each of the n-side mesa post regions 156. That is, the n-side mesa post region 156 is provided in the middle of groups of a plurality of light emitting units 120 arranged in the X-axis direction. An n-side contact region 157 is provided adjacent to the n-side mesa post region 156, and is provided in the middle of the groups of the plurality of light emitting units 120.

In the surface emitting laser 200, the smallest distance among the smallest distances between respective ones of the plurality of surface emitting laser elements 151 and the n-side contact region 157 is smaller than the largest distance among the distances between the plurality of surface emitting laser elements 151.

The other configurations are similar to those in the first embodiment.

The second embodiment also attains effects similar to those of the first embodiment. When the number of the surface emitting laser elements 151 arranged in the X-axis direction of the surface emitting laser 100 is equal to that of the surface emitting laser 200, the distance from the n-side mesa post region 156 to the surface emitting laser element 151 farthest from the n-side mesa post region 156 in the X-axis direction in the surface emitting laser 200 is smaller than that in the surface emitting laser 100. For example, in the surface emitting laser 200, when the n-side mesa post region 156 is disposed at the center of the plurality of surface emitting laser elements 151 arranged in the X-axis direction, the distance from the n-side mesa post region 156 to the surface emitting laser element 151 farthest from the n-side mesa post region 156 in the X-axis direction is a half of that distance in the surface emitting laser 100. Thus, according to the second embodiment, it is possible to reduce the difference in the n-side resistance between the plurality of surface emitting laser elements 151, and it is possible to improve the uniformity of the characteristics of the respective elements. Further, it is possible to reduce a voltage drop caused by the electrical resistance of the substrate 101, and it is possible to obtain stronger light emission.

The first embodiment and the second embodiment may be combined with each other. That is, the n-side mesa post region 156 may be provided at a plurality of positions outside and in the middle of the groups of the plurality of light emitting units 120 arranged in the X-axis direction. Further, the n-side mesa post region 156 may be provided outside the end portion on the +X side of the groups of the light emitting units 120 in addition to outside the end portion on the −X side of the groups of the light emitting units 120.

Figure 13:
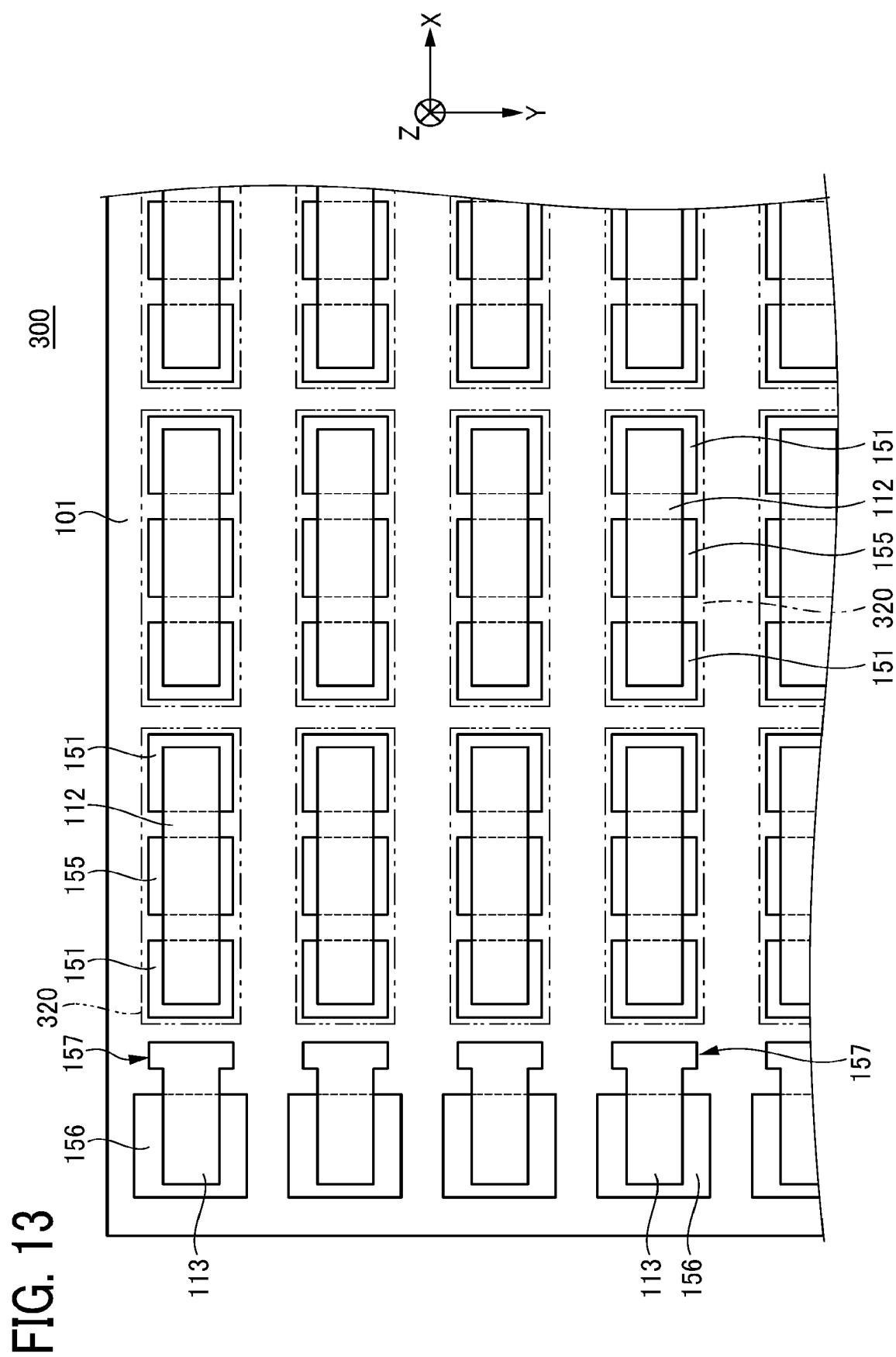
FIG. 13 is a schematic view illustrating an overview of a layout of a surface emitting laser according to a third embodiment.

Next, a third embodiment will be described. The third embodiment differs from the first embodiment mainly in terms of the configuration of a light emitting unit. FIG. 13 is a schematic view illustrating an overview of a layout of a surface emitting laser according to the third embodiment.

As illustrated in FIG. 13, in a surface emitting laser 300 according to the third embodiment, surface emitting laser elements 151 are disposed on both sides of a p-side mesa post region 155 in the X-axis direction, that is, on both the +X side and the −X side, and a p-side electrode 112 on the p-side mesa post region 155 overlaps the two surface emitting laser elements 151 in plan view. The p-side electrode 112 is connected to a p-side contact layer 116 of the two surface emitting laser elements 151. In the surface emitting laser 300, a set of the two surface emitting laser elements 151 and the p-side mesa post region 155 overlapping the p-side electrode 112 in plan view is included in a light emitting unit 320.

The other configurations are similar to those in the first embodiment.

The third embodiment also attains effects similar to those of the first embodiment. Moreover, since the number of p-side mesa post regions 155 is a half of the number of surface emitting laser elements 151, the degree of integration of the surface emitting laser elements 151 can be further improved.

Figure 14:
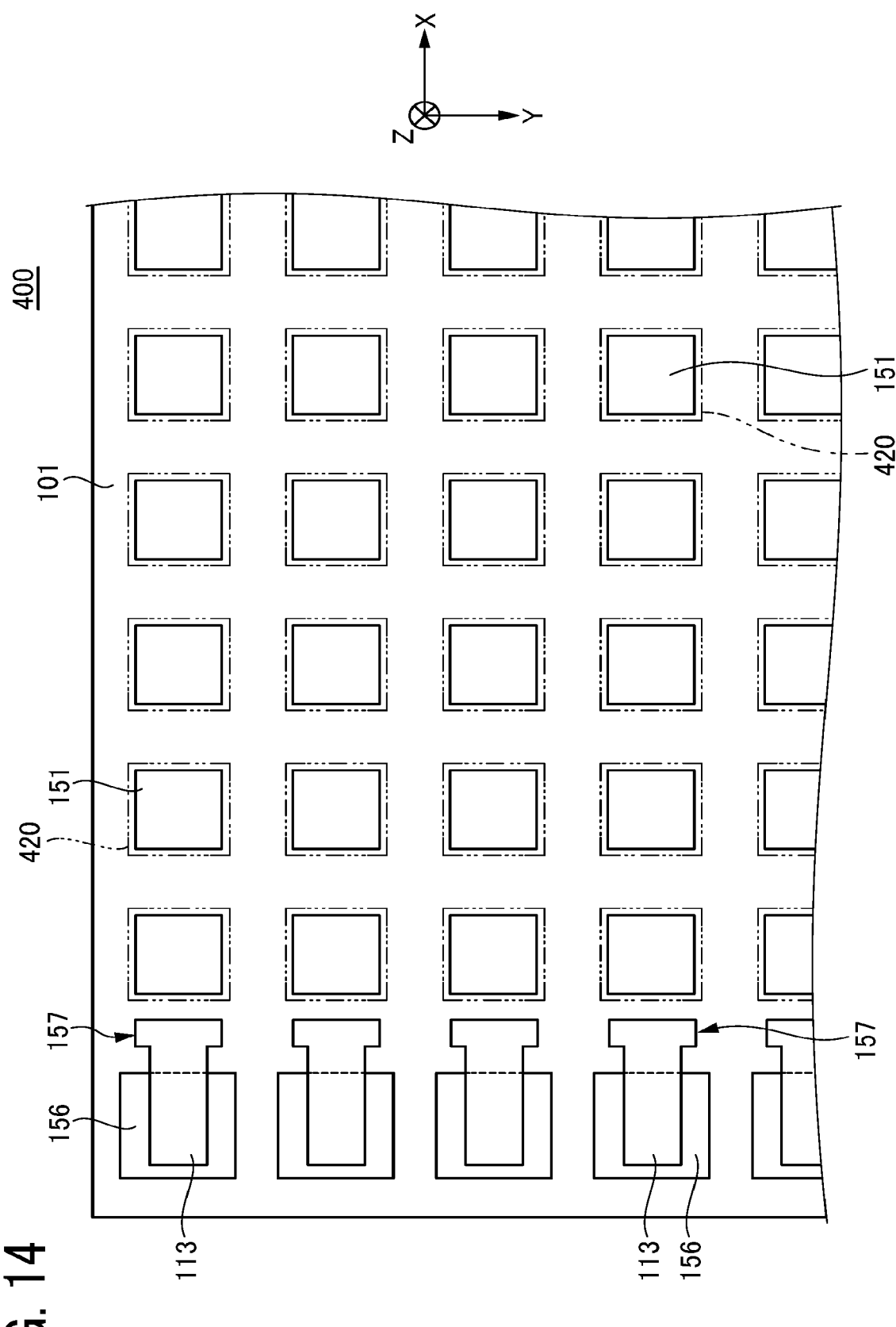
FIG. 14 is a schematic view illustrating an overview of a layout of a surface emitting laser according to a fourth embodiment.

Next, a fourth embodiment will be described. The fourth embodiment differs from the first embodiment mainly in terms of the configuration of a light emitting unit. FIG. 14 is a schematic view illustrating an overview of a layout of the surface emitting laser according to the fourth embodiment.

As illustrated in FIG. 14, in a surface emitting laser 400 according to the fourth embodiment, the p-side mesa post region 155 is not provided, and a surface emitting laser element 151 is included in a light emitting unit 420. In the surface emitting laser 400, a p-side electrode 112 is connected to a p-side electrode of a mount substrate such as a driver IC or a submount in a region overlapping the surface emitting laser element 151 in plan view. That is, in the present embodiment, substantially the entirety of the p-side electrode 112 is an example of a second connection portion.

The other configurations are similar to those in the first embodiment.

According to the fourth embodiment, the degree of integration of the surface emitting laser elements 151 can be further improved.

Figure 15:
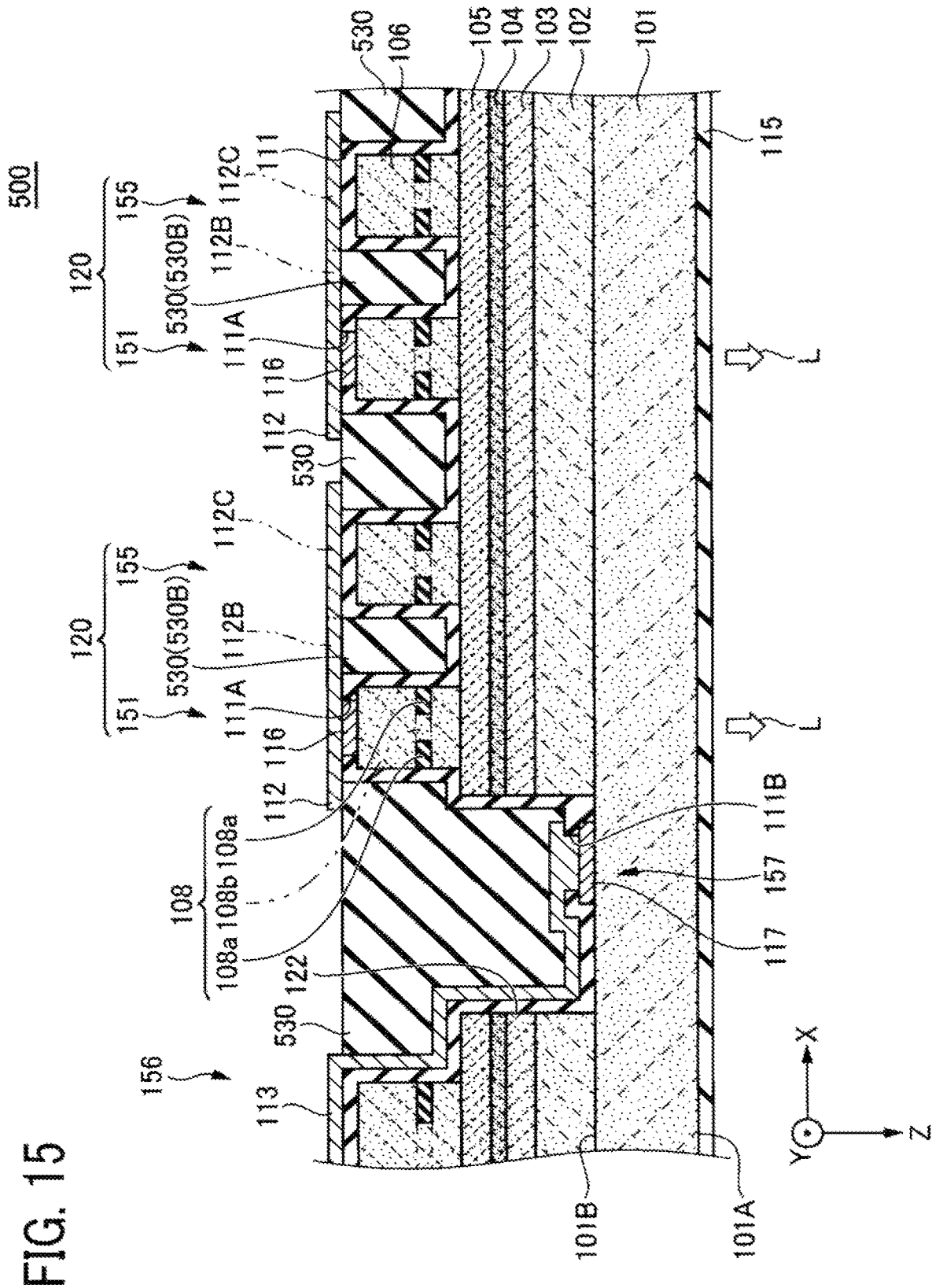
FIG. 15 is a cross-sectional view illustrating an internal structure of a surface emitting laser according to a fifth embodiment.

Next, a fifth embodiment will be described. The fifth embodiment differs from the first embodiment mainly in terms of the configuration of a p-side electrode. FIG. 15 is a cross-sectional view illustrating an internal structure of the surface emitting laser according to the fifth embodiment.

As illustrated in FIG. 15, in a surface emitting laser 500 according to the fifth embodiment, an insulating layer 530 is provided inside a groove 122 and between mesa structures. The insulating layer 530 is, for example, a resin layer made of polyimide or the like. A p-side electrode 112 is provided on the upper surface of the insulating layer 530, not on the upper surface of the insulating film 111, between a surface emitting laser element 151 and a p-side mesa post region 155. The insulating layer 530 insulates the surface emitting laser element 151 and the p-side mesa post region 155 from each other.

The other configurations are similar to those in the first embodiment.

The fifth embodiment also attains effects similar to those of the first embodiment. Further, the heat generated in an active layer 104 of the surface emitting laser element 151 is rapidly transferred to a portion of the p-side electrode 112 on the −Z side (upper side) of the p-side mesa post region 155. Since the p-side electrode 112 is connected to a p-side electrode of a mount substrate in a region overlapping the p-side mesa post region 155 in plan view, heat is quickly dissipated to the mount substrate. Thus, it is possible to improve heat dissipation property. By improving the heat dissipation property, it is possible to suppress output saturation due to the heat generated in the surface emitting laser element 151 and to improve the reliability of the operation. A portion 112B of the p-side electrode 112 between the surface emitting laser element 151 and the p-side mesa post region 155 is an example of a second heat transfer portion, and a portion 530B of the insulating layer 530 below the second heat transfer portion 112B is an example of a second insulating layer.

Note that, in the present embodiment, the insulating layer 530 that completely fills the inside of the groove 122 and the gap between the mesa structures is provided, however, the present disclosure is not limited thereto. For example, the insulating layer 530 may fill a portion of the inside of the groove 122 and a portion of the gap between the mesa structures, and the second heat transfer portion 112B may enter the inside of the groove 122 and the gap between the mesa structures on the insulating layer 530. Also, the insulating layer 530 does not have to be provided, and the second heat transfer portion 112B may be directly formed on the insulating film 111. In this case, the insulating film 111 is an example of a second insulating layer. In any case, the second heat transfer portion 112B may have a thickness similar to that of the other portion of the p-side electrode 112, and the second heat transfer portion 112B may be made thicker to fill the inside of the groove 122 and the gap between the mesa structures.

Figure 16:
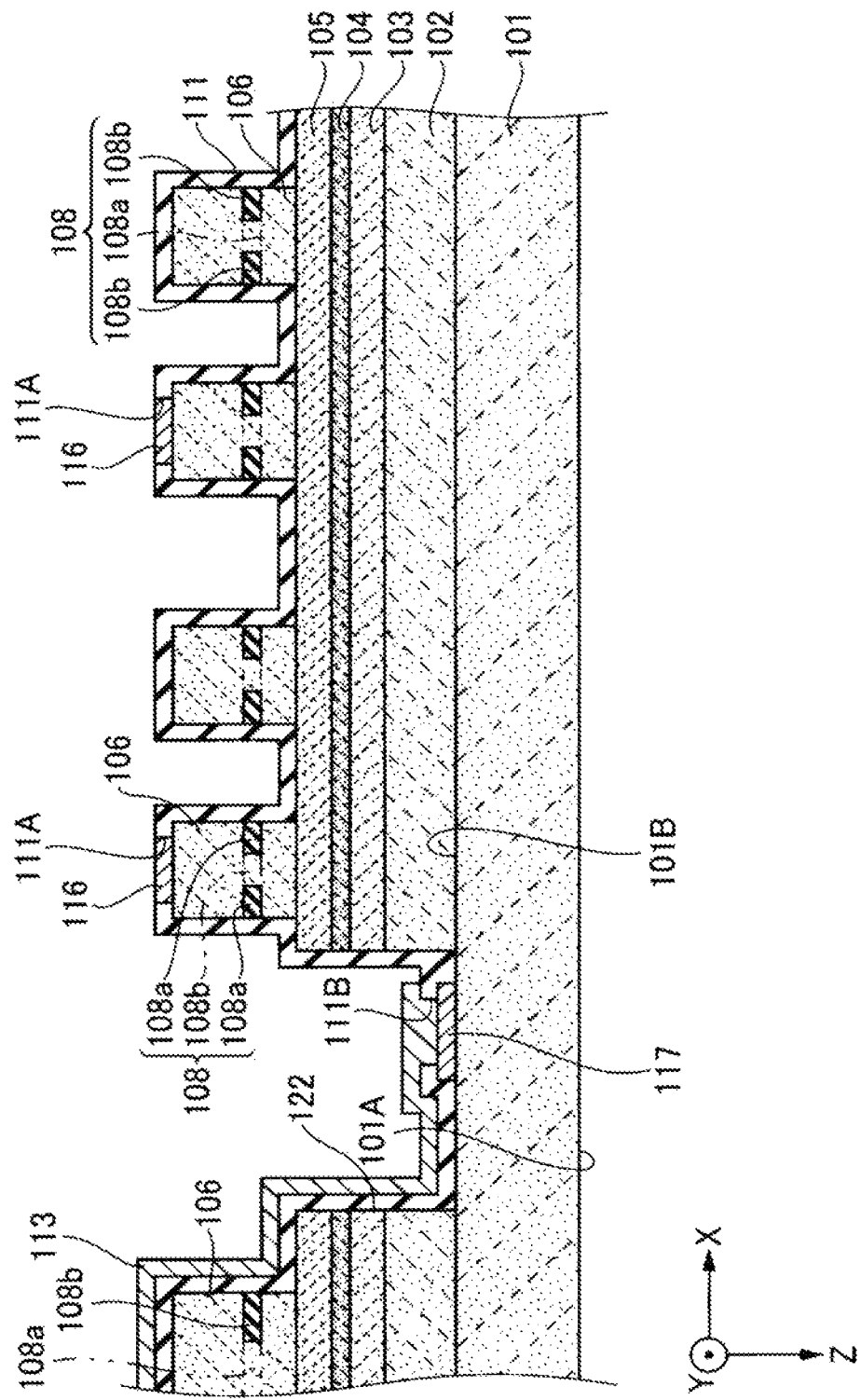
FIG. 16 is a cross-sectional view (first view) illustrating a method for manufacturing the surface emitting laser according to the fifth embodiment.
Figure 17:
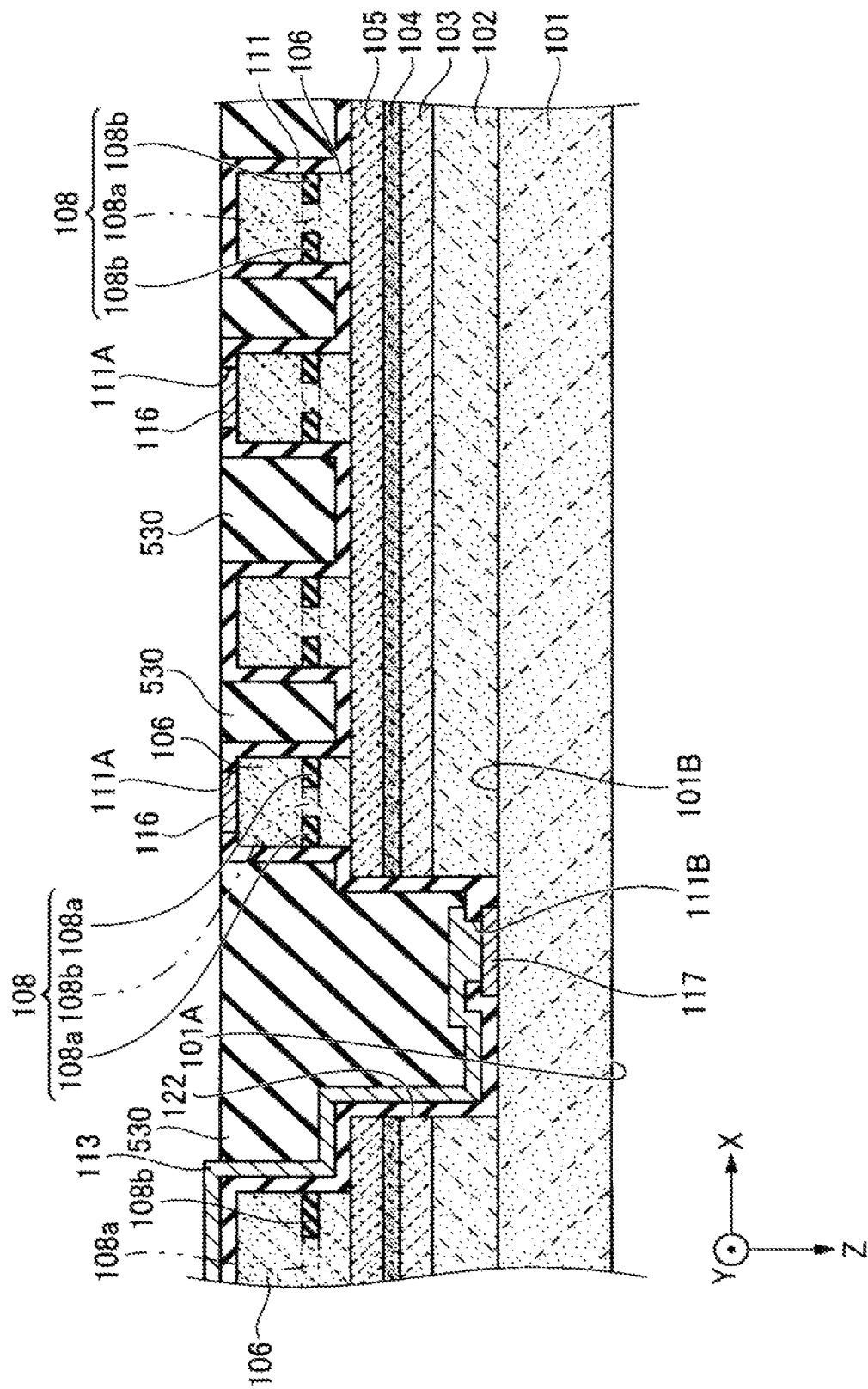
FIG. 17 is a cross-sectional view (second view) illustrating the method for manufacturing the surface emitting laser according to the fifth embodiment.
Figure 18:
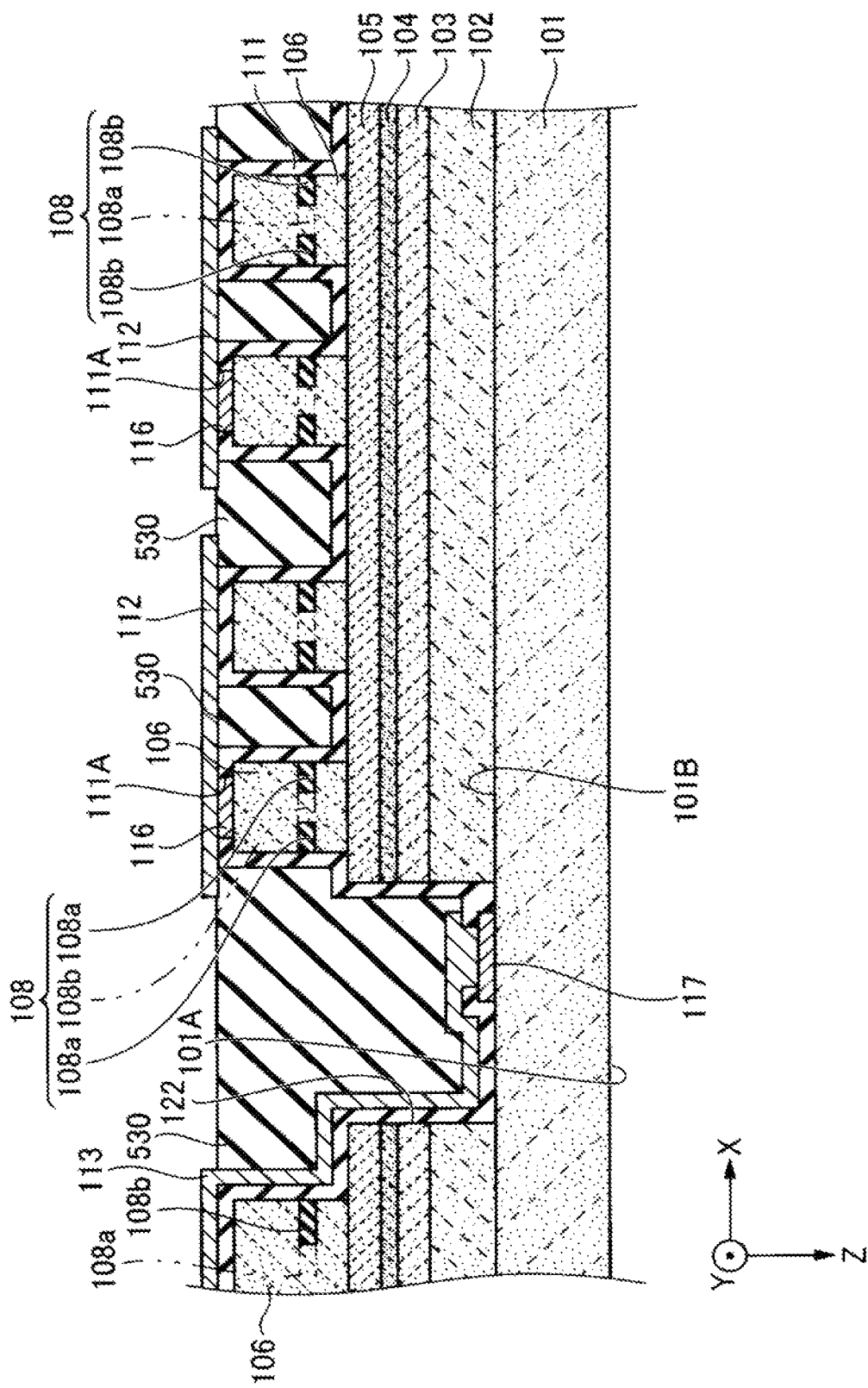
FIG. 18 is a cross-sectional view (third view) illustrating the method for manufacturing the surface emitting laser according to the fifth embodiment.

A method for manufacturing the surface emitting laser 500 will be described. FIGS. 16 to 18 are cross-sectional views illustrating a method for manufacturing the surface emitting laser 500 according to the fifth embodiment.

First, processing up to formation of openings 111A and 111B is performed in a manner similar to that in the first embodiment (see FIG. 10). Next, as illustrated in FIG. 16, an n-side electrode 113 is formed in a region corresponding to the n-side mesa post region 156. The n-side electrode 113 can be formed by, for example, a lift-off method. Then, as illustrated in FIG. 17, the insulating layer 530 is formed inside the groove 122 and between the mesa structures. Subsequently, as illustrated in FIG. 18, the p-side electrode 112 is formed in a region corresponding to the surface emitting laser element 151 and a region corresponding to the p-side mesa post region 155. The p-side electrode 112 can be formed by, for example, a lift-off method.

Then, a back surface 101A of a substrate 101 is polished and mirror-finished, and an anti-reflection film 115 is formed on the back surface 101A (see FIG. 15).

In this way, it is possible to manufacture the surface emitting laser 500.

Figure 19:
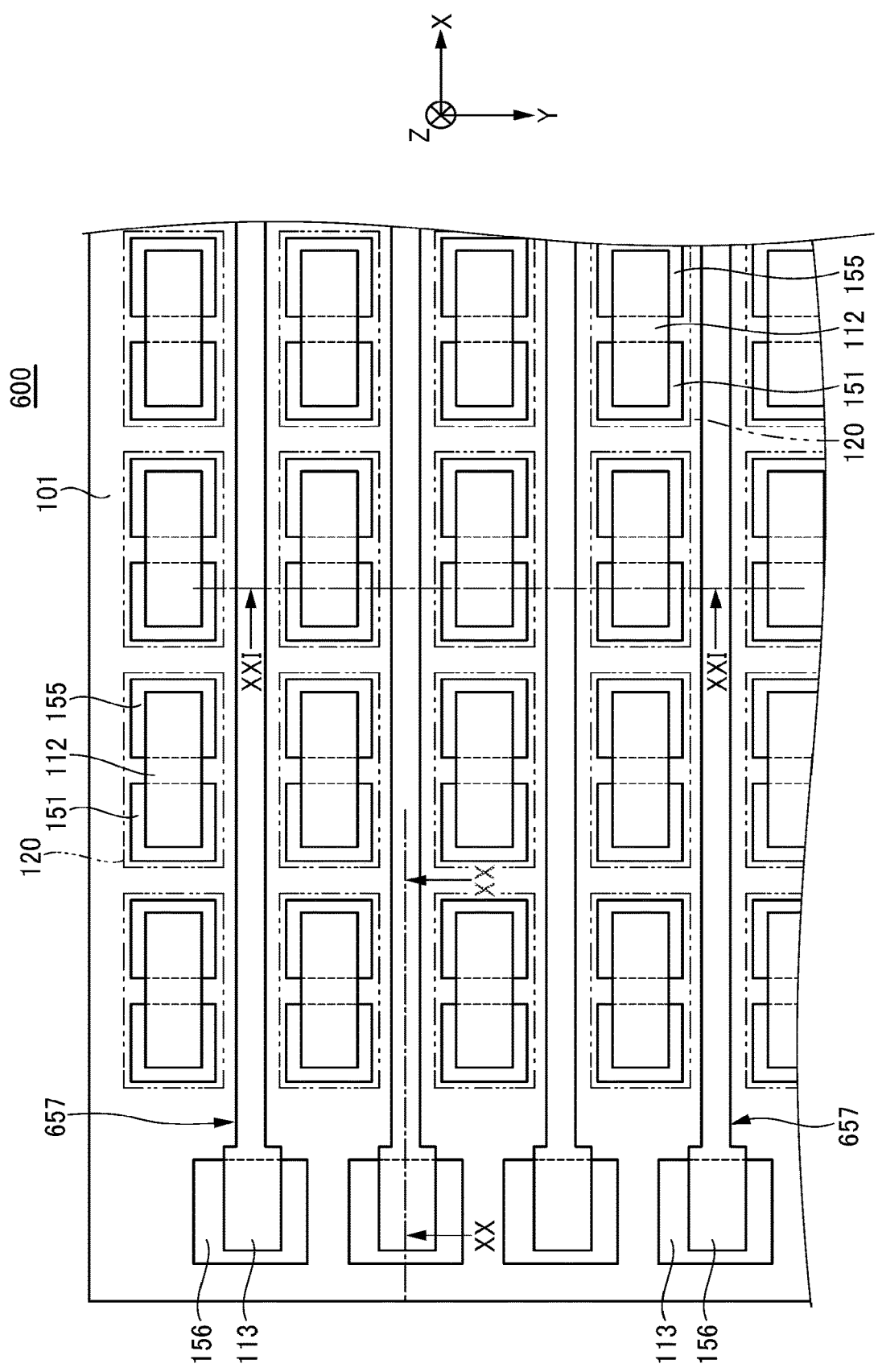
FIG. 19 is a schematic view illustrating an overview of a layout of a surface emitting laser according to a sixth embodiment.
Figure 20:
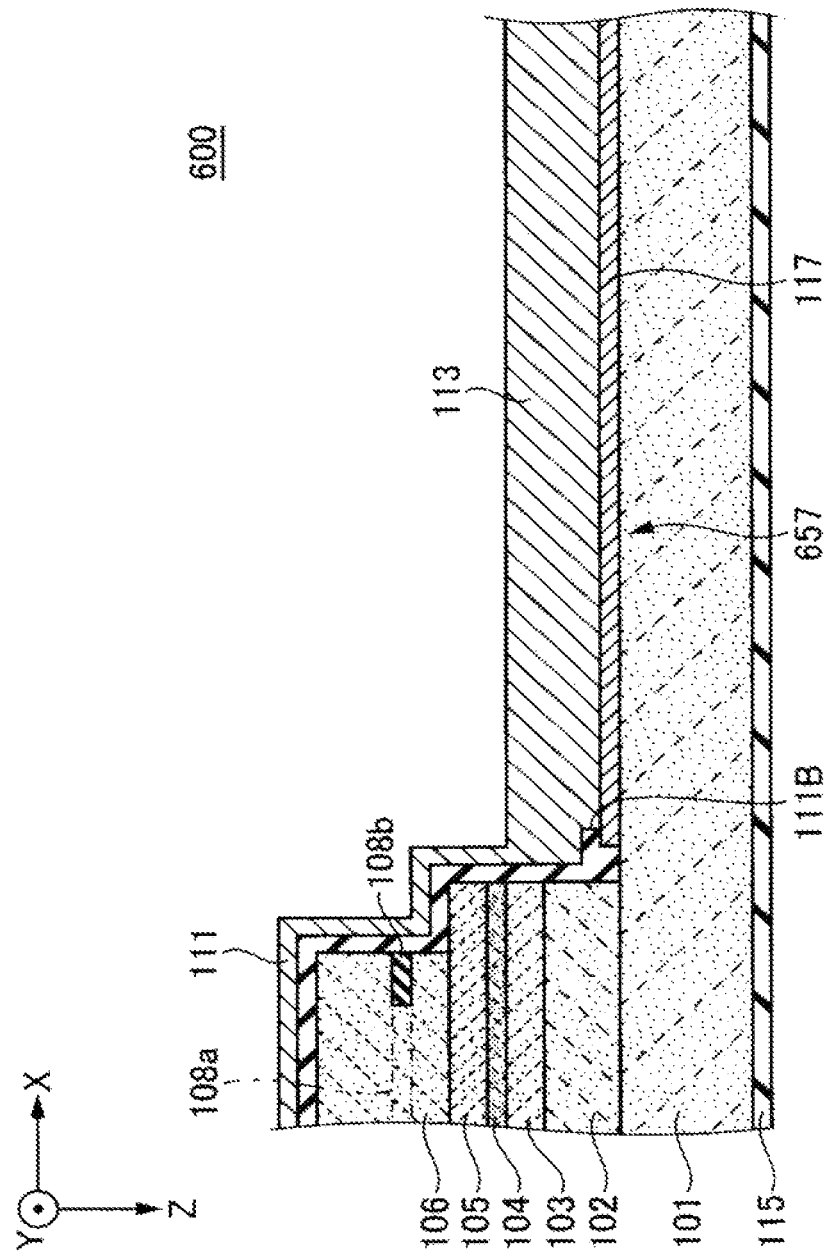
FIG. 20 is a cross-sectional view (first view) illustrating an internal structure of the surface emitting laser according to the sixth embodiment.
Figure 21:
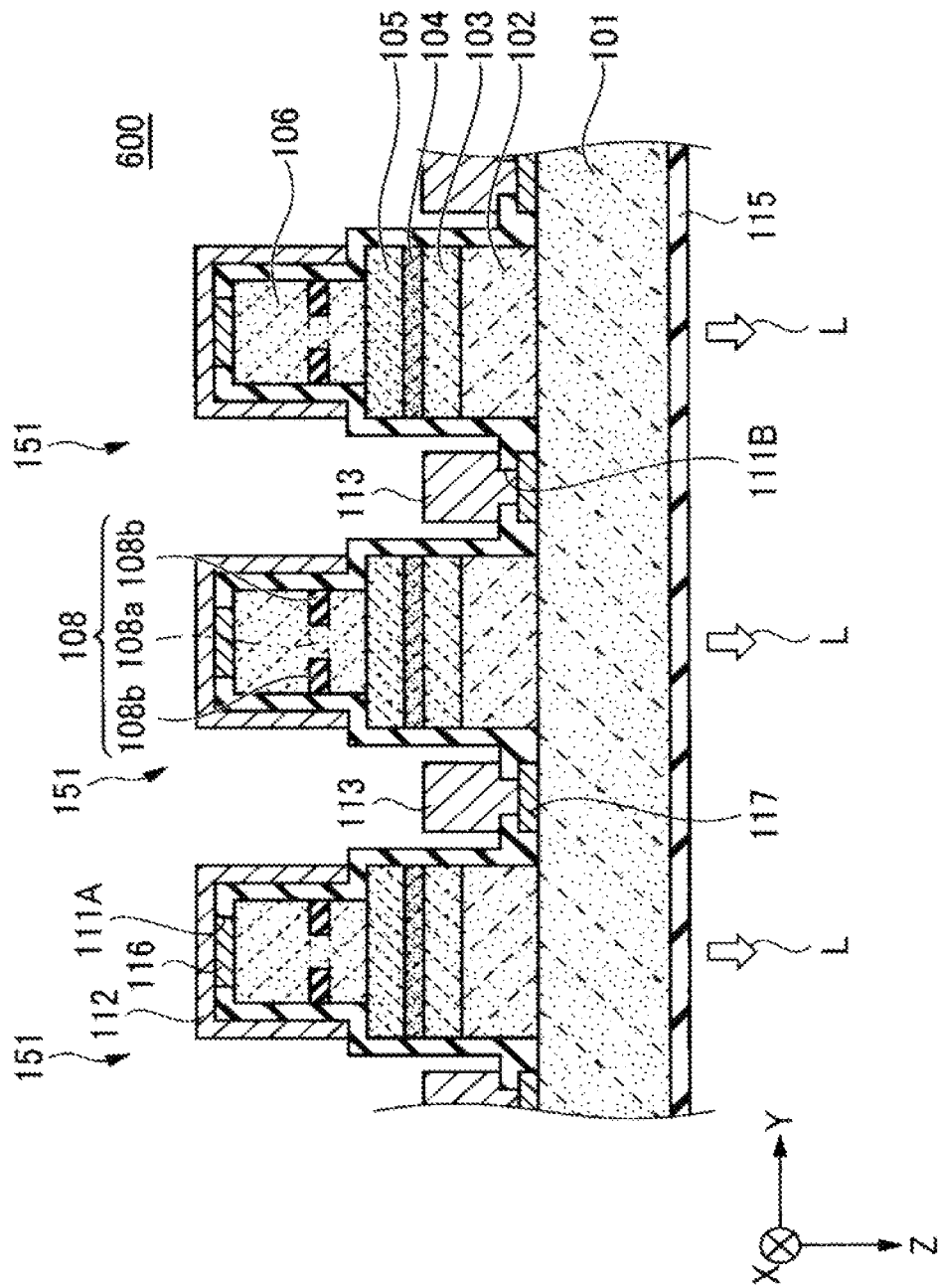
FIG. 21 is a cross-sectional view (second view) illustrating the internal structure of the surface emitting laser according to the sixth embodiment.

Next, a sixth embodiment will be described. The sixth embodiment differs from the first embodiment mainly in terms of the configurations of an n-side electrode and an n-side contact region. FIG. 19 is a schematic view illustrating an overview of a layout of the surface emitting laser according to the sixth embodiment. FIGS. 20 and 21 are cross-sectional views illustrating an internal structure of the surface emitting laser according to the sixth embodiment. FIG. 20 corresponds to a cross-sectional view taken along line XX-XX in FIG. 19. FIG. 21 corresponds to a cross-sectional view taken along line XXI-XXI in FIG. 19.

As illustrated in FIG. 19, in a surface emitting laser 600 according to the sixth embodiment, an n-side mesa post region 156 is provided outside a group of a plurality of light emitting units 120 arranged in the X-axis direction and on a side of the center of groups of a plurality of light emitting units 120 adjacent to each other in the Y-axis direction. As illustrated in FIGS. 19 to 21, instead of the n-side contact region 157, an n-side contact region 657, in which an n-side electrode 113 is electrically connected to a substrate 101, is provided to extend in the X-axis direction, between the groups of the light emitting units 120 adjacent to each other in the Y-axis direction. The group of the plurality of light emitting units 120 aligned in the X-axis direction is an example of a light emitting unit group, the n-side contact region 657 is an example of a first contact region, and a portion of the n-side electrode 113 included in the n-side contact region 657 is an example of a first portion.

In the surface emitting laser 600, the smallest distance among the smallest distances between respective ones of the plurality of surface emitting laser elements 151 and the n-side contact region 657 is smaller than the largest distance among the distances between the plurality of surface emitting laser elements 151.

The other configurations are similar to those in the first embodiment.

The sixth embodiment also attains effects similar to those of the first embodiment. Further, in the present embodiment, the difference in distance between the n-side electrode 113 and each of the surface emitting laser elements 151 can be further reduced than that in the second embodiment. Thus, it is possible to further reduce the difference in the n-side resistance between the plurality of surface emitting laser elements 151 due to the difference in the positions of the plurality of surface emitting laser elements 151, and it is possible to improve the uniformity of the characteristics of the respective elements. Further, in the present embodiment, the distance between the n-side electrode 113 and the surface emitting laser element 151, that is, the distance through which injected electrons travel in the substrate, can be shortened. Since the electrical resistance of the n-side electrode 113 is about $1/100$ of the electrical resistance of the substrate 101, it is possible to significantly reduce the voltage drop due to the electrical resistance of the substrate 101. Thus, according to the sixth embodiment, it is possible to obtain stronger light emission in the entirety of the plurality of surface emitting laser elements 151 of the surface emitting laser 600.

It is desirable that a portion of the n-side electrode 113 on an n-side contact layer 117, that is, a portion of the n-side electrode 113 located substantially in the n-side contact region 657, is formed thicker than a portion of the n-side electrode 113 on an insulating film 111. This is to further reduce the electrical resistance of the n-side electrode 113. Since the portion of the n-side electrode 113 on the n-side contact layer 117 is inside a groove 122, the thickness of the n-side electrode 113 on the n-side contact layer 117 hardly affects the thickness of the surface emitting laser 600.

Figure 22:
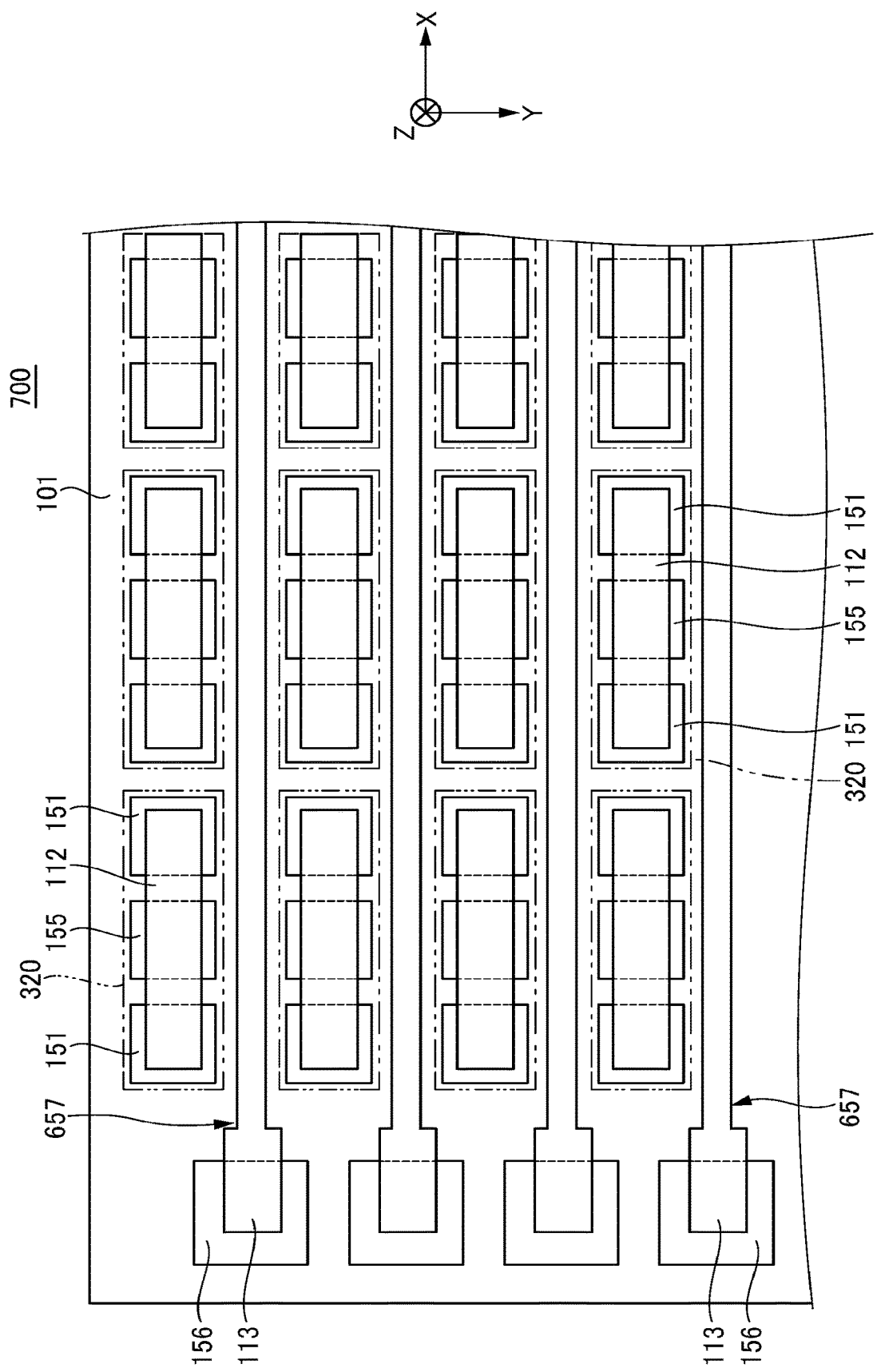
FIG. 22 is a schematic view illustrating an overview of a layout of a surface emitting laser according to a seventh embodiment.

Next, a seventh embodiment is described. The seventh embodiment differs from the sixth embodiment mainly in terms of the configuration of a light emitting unit. FIG. 22 is a schematic view illustrating an overview of a layout of the surface emitting laser according to the seventh embodiment.

As illustrated in FIG. 22, in a surface emitting laser 700 according to the seventh embodiment, surface emitting laser elements 151 are disposed on both sides of a p-side mesa post region 155 in the X-axis direction, that is, on both the +X side and the −X side, and a p-side electrode 112 on the p-side mesa post region 155 overlaps the two surface emitting laser elements 151 in plan view. The p-side electrode 112 is connected to a p-side contact layer 116 of the two surface emitting laser elements 151. In the surface emitting laser 700, as in the third embodiment, a set of the two surface emitting laser elements 151 and the p-side mesa post region 155 overlapping the p-side electrode 112 in plan view is included in a light emitting unit 320.

The other configurations are similar to those in the sixth embodiment.

The seventh embodiment also attains effects similar to those of the sixth embodiment. Moreover, since the number of p-side mesa post regions 155 is a half of the number of surface emitting laser elements 151, the degree of integration of the surface emitting laser elements 151 can be further improved.

Figure 23:
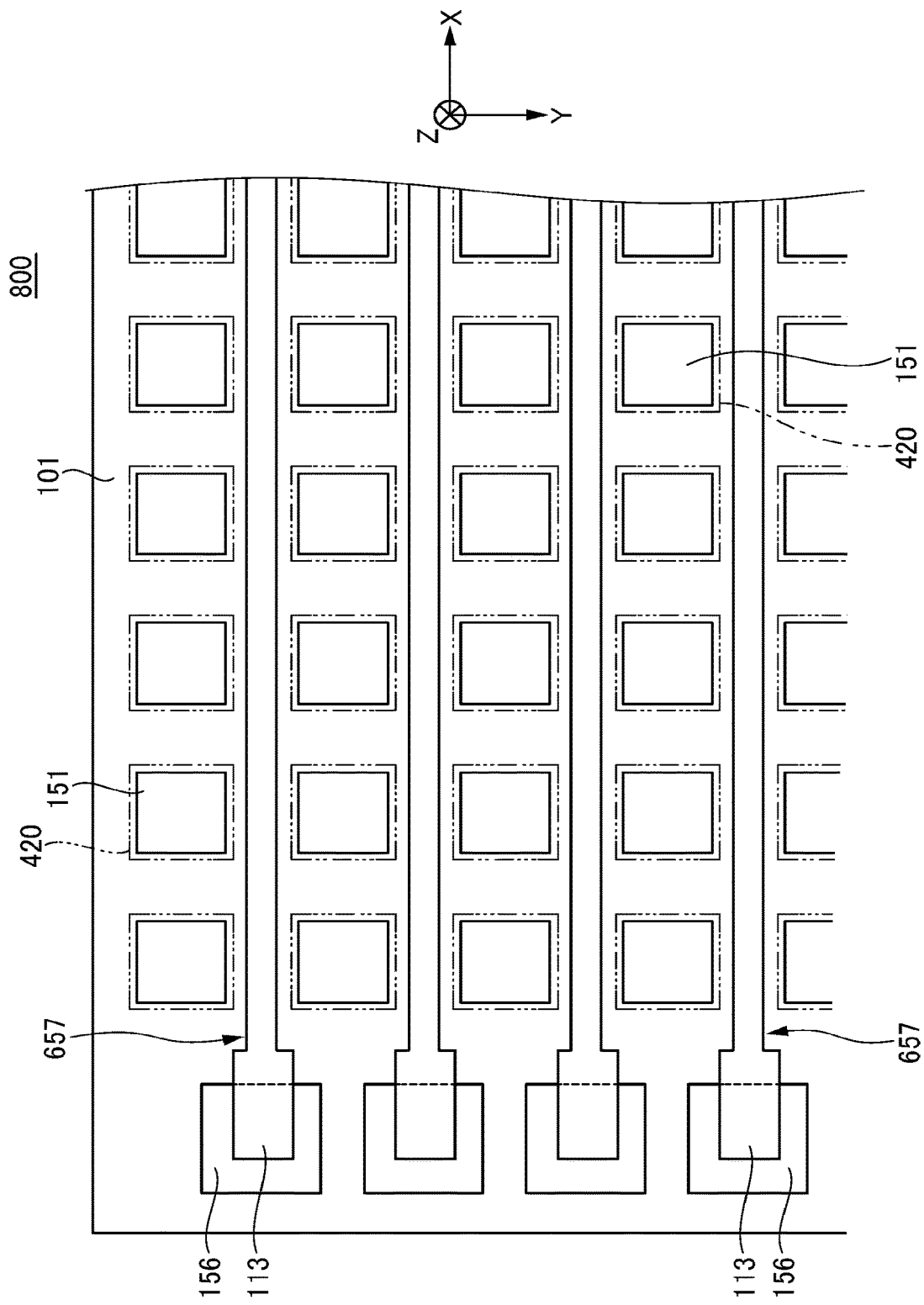
FIG. 23 is a schematic view illustrating an overview of a layout of a surface emitting laser according to an eighth embodiment.

Next, an eighth embodiment is described. The eighth embodiment differs from the sixth embodiment mainly in terms of the configuration of a light emitting unit. FIG. 23 is a schematic view illustrating an overview of a layout of the surface emitting laser according to the eighth embodiment.

As illustrated in FIG. 23, in a surface emitting laser 800 according to the eighth embodiment, as in the fourth embodiment, the p-side mesa post region 155 is not provided, and a surface emitting laser element 151 is included in a light emitting unit 420. In the surface emitting laser 800, a p-side electrode 112 is connected to a p-side electrode of a mount substrate such as a driver IC or a submount in a region overlapping the surface emitting laser element 151 in plan view.

The other configurations are similar to those in the sixth embodiment.

According to the eighth embodiment, the degree of integration of the surface emitting laser elements 151 can be further improved.

Figure 24:
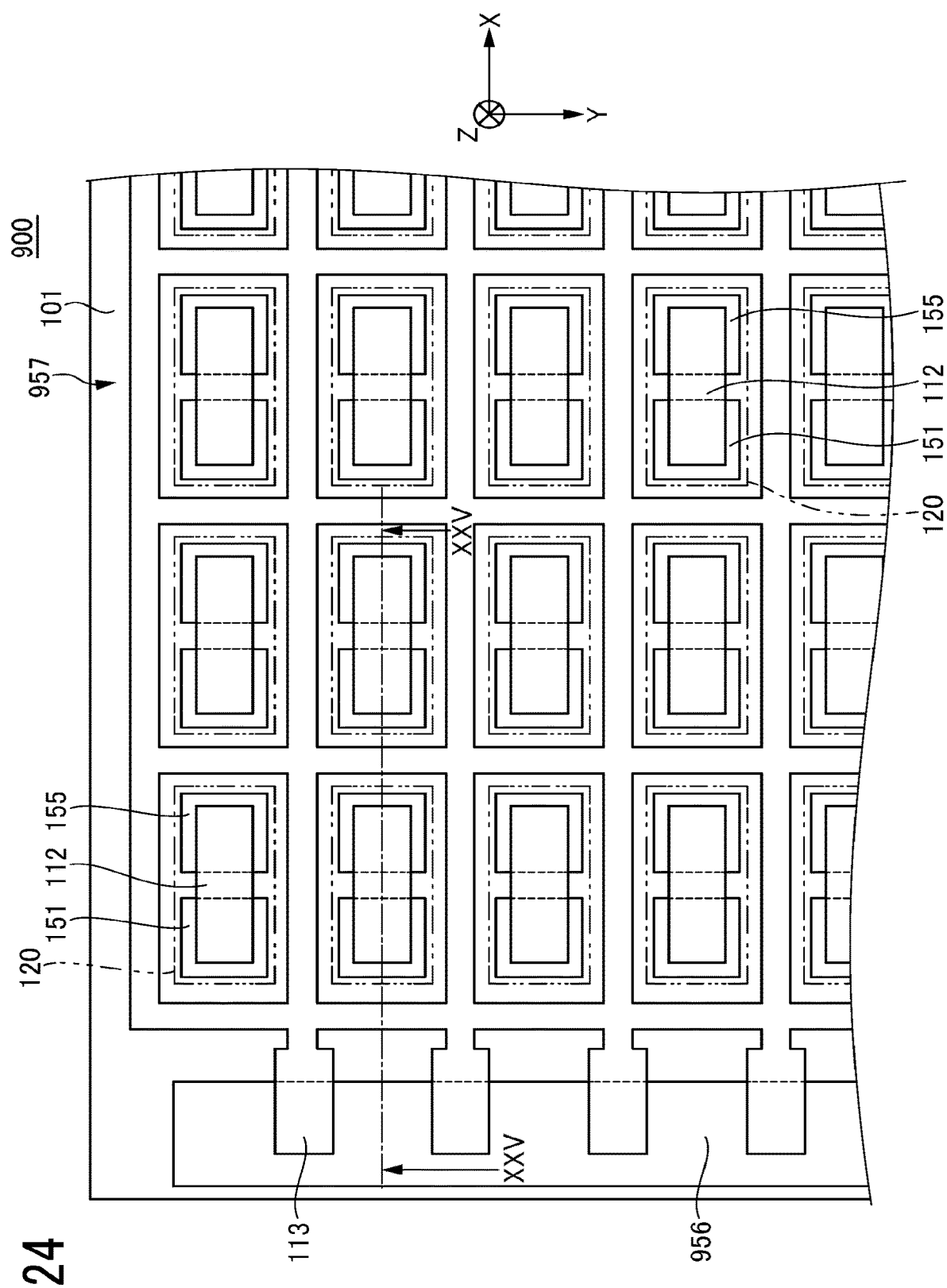
FIG. 24 is a schematic view illustrating an overview of a layout of a surface emitting laser according to a ninth embodiment.
Figure 25:
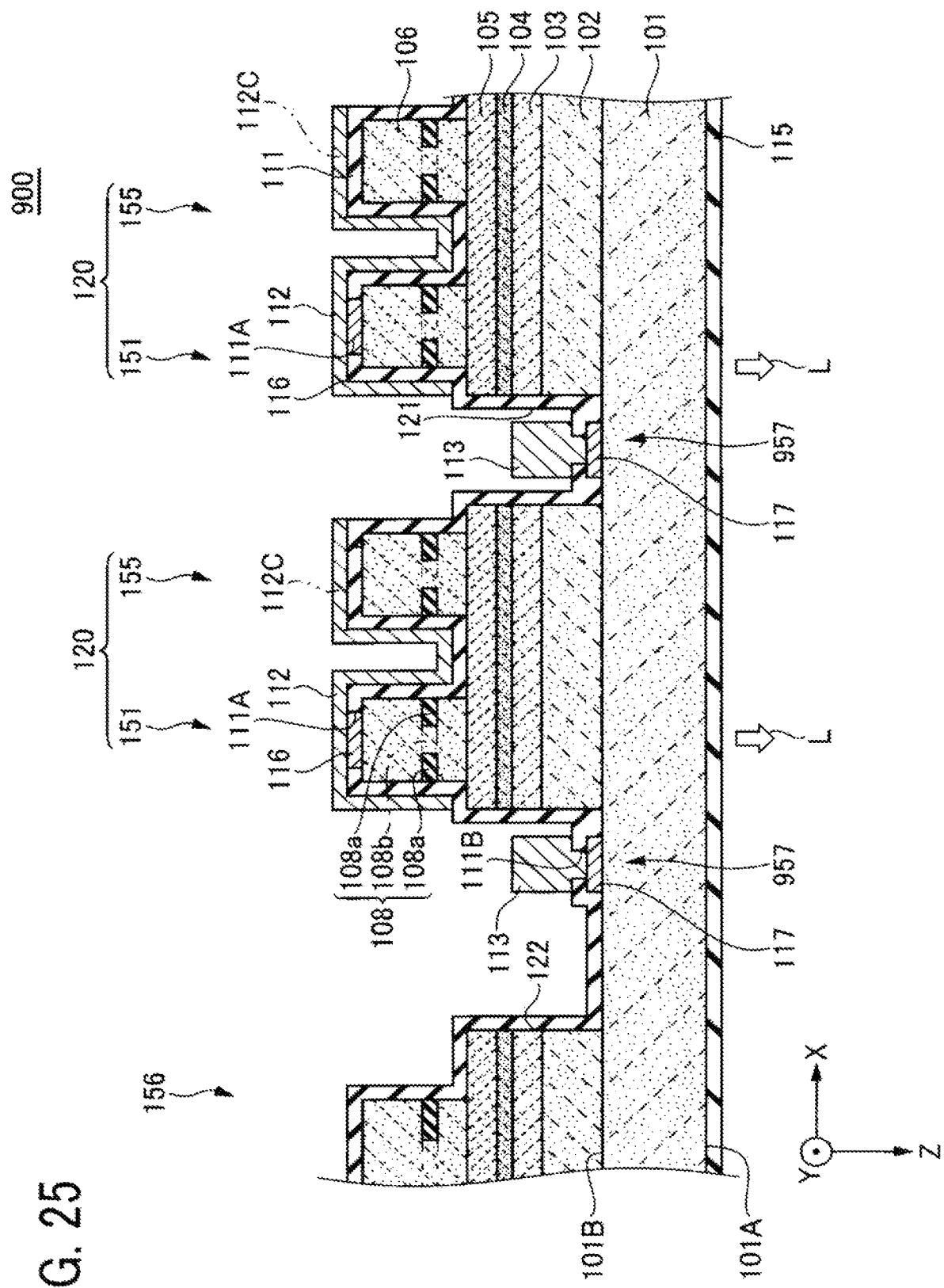
FIG. 25 is a cross-sectional view illustrating an internal structure of the surface emitting laser according to the ninth embodiment.

Next, a ninth embodiment is described. The ninth embodiment differs from the sixth embodiment mainly in terms of the configurations of an n-side electrode, an n-side contact region, and an n-side mesa post region. FIG. 24 is a schematic view illustrating an overview of a layout of the surface emitting laser according to the ninth embodiment. FIG. 25 is a cross-sectional view illustrating an internal structure of the surface emitting laser according to the ninth embodiment. FIG. 25 corresponds to a cross-sectional view taken along line XXV-XXV in FIG. 24.

As illustrated in FIGS. 24 and 25, a surface emitting laser 900 according to the ninth embodiment has, instead of the n-side contact region 657, an n-side contact region 957 in a lattice shape in plan view. The n-side contact region 957 has a plurality of portions extending in the X-axis direction between groups of light emitting units 120 adjacent to each other in the Y-axis direction, and a plurality of portions extending in the Y-axis direction between groups of light emitting units 120 adjacent to each other in the X-axis direction. The n-side contact region 957 further has a portion extending in the X-axis direction outside a set of all the light emitting units 120 and a portion extending in the Y-axis direction outside the set of all the light emitting units 120. A portion extending in the Y-axis direction between the groups of the light emitting units 120 adjacent to each other in the X-axis direction connects the plurality of portions extending in the X-axis direction between the groups of the light emitting units 120 adjacent to each other in the Y-axis direction. In addition, the surface emitting laser 900 includes an n-side mesa post region 956 extending in the Y-axis direction, instead of the plurality of n-side mesa post regions 156 aligned in the Y-axis direction. The n-side contact region 957 is an example of a first contact region. A portion of an n-side electrode 113 included in the n-side contact region 957 and extending in the X-axis direction between the groups of the light emitting units 120 adjacent to each other in the Y-axis direction is an example of a first portion. A portion of the n-side electrode 113 included in the n-side contact region 957 and extending in the Y-axis direction between the groups of the light emitting units 120 adjacent to each other in the X-axis direction is an example of a second portion.

In the surface emitting laser 900, the smallest distance among the smallest distances between respective ones of the plurality of surface emitting laser elements 151 and the n-side contact region 957 is smaller than the largest distance among the distances between the plurality of surface emitting laser elements 151.

The other configurations are similar to those in the sixth embodiment.

The ninth embodiment also attains effects similar to those of the sixth embodiment. Further, since the n-side electrode 113 is connected in the X-axis direction and the Y-axis direction, even when a disconnection occurs in any portion of the n-side electrode 113, it is possible to supply electricity through another path. Accordingly, it is possible to maintain good light emission characteristics of the entire surface emitting laser 900. Further, since the n-side contact region 957 is provided in three directions of the surface emitting laser element 151 in plan view, it is possible to further reduce the voltage drop caused by the electrical resistance of the substrate 101.

Further, in the present embodiment, when the n-side electrode 113 is connected to an n-side electrode of a mount substrate while the inside of the region overlapping the n-side mesa post region 956 in plan view serves as a connection portion, by providing a plurality of connection portions, the light emitting characteristics of the entire surface emitting laser 900 can be properly maintained. This is because, even when a connection portion having a partial connection failure is generated when being mounted on the mount substrate, since the plurality of connection portions are provided, electricity can be supplied via the other connection portions.

Note that, in the present embodiment, the n-side electrode 113 is configured to extend in parallel to the X-axis direction and the Y-axis direction that are orthogonal to each other, however, the present disclosure is not limited thereto. A plurality of portions extending in at least two directions may be connected to each other, and may be curved instead of linear.

Figure 26:
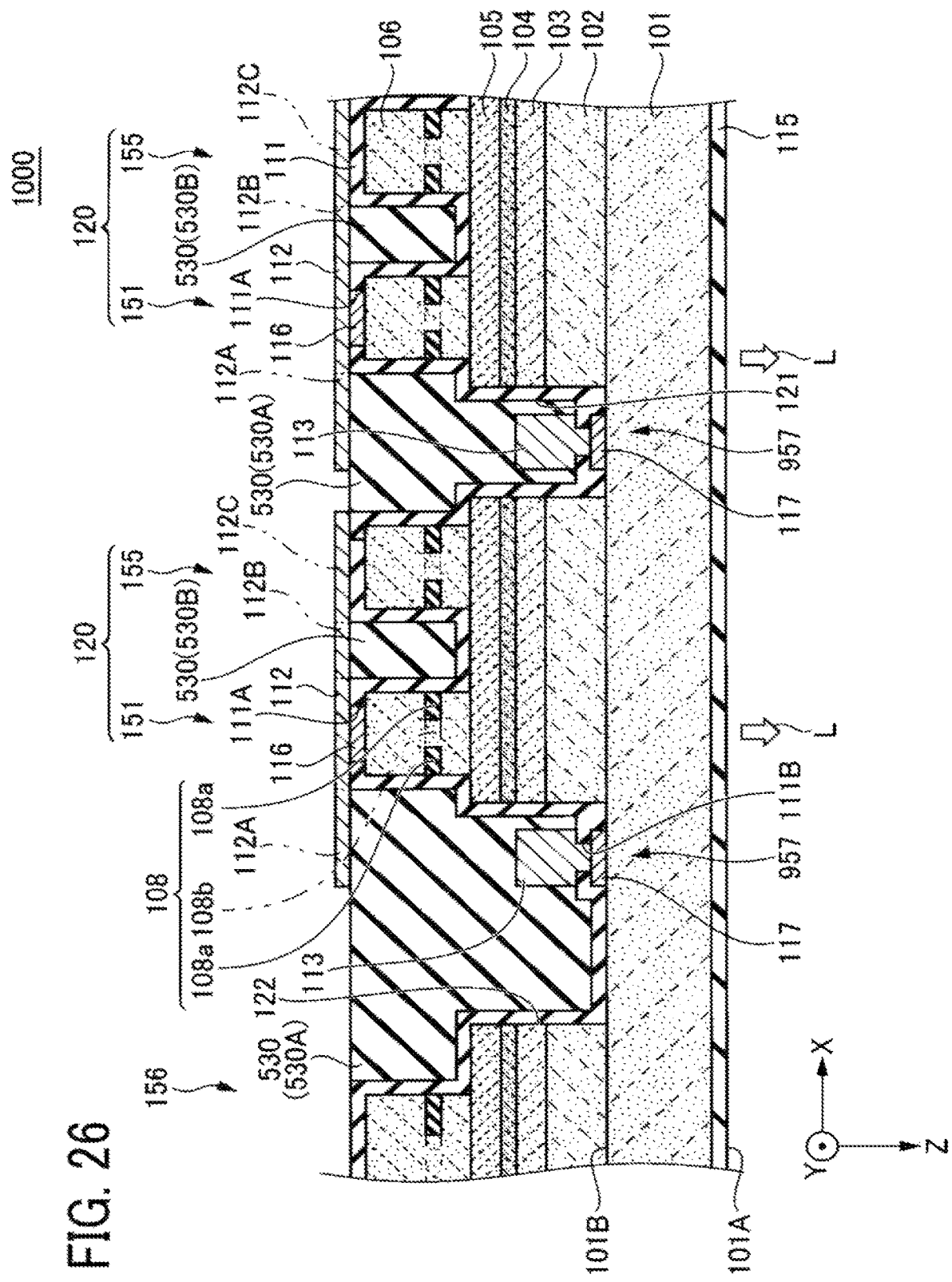
FIG. 26 is a cross-sectional view illustrating an internal structure of a surface emitting laser according to a tenth embodiment.

Next, a tenth embodiment is described. The tenth embodiment differs from the ninth embodiment mainly in terms of the configuration of a p-side electrode. FIG. 26 is a cross-sectional view illustrating an internal structure of a surface emitting laser according to the tenth embodiment.

As illustrated in FIG. 26, in a surface emitting laser 1000 according to the tenth embodiment, as in the fifth embodiment, an insulating layer 530 is provided inside a groove 122 and between mesa structures. The insulating layer 530 is, for example, a resin layer made of polyimide or the like. A p-side electrode 112 is provided on the upper surface of the insulating layer 530, not on the upper surface of the insulating film 111, between a surface emitting laser element 151 and a p-side mesa post region 155. The insulating layer 530 insulates the surface emitting laser element 151 and the p-side mesa post region 155 from each other. The p-side electrode 112 extends onto a portion of the n-side contact region 957 extending in the Y-axis direction.

The other configurations are similar to those in the ninth embodiment.

The tenth embodiment also attains effects similar to those of the ninth embodiment. Further, the heat generated in an active layer 104 of the surface emitting laser element 151 is rapidly transferred to a portion of the p-side electrode 112 on the −Z side (upper side) of the p-side mesa post region 155. Since the p-side electrode 112 is connected to a p-side electrode of a mount substrate in a region overlapping the p-side mesa post region 155 in plan view, heat is quickly dissipated to the mount substrate. Further, the heat is also dissipated from a portion of the p-side electrode 112 on the portion of the n-side contact region 957 extending in the Y-axis direction. Thus, it is possible to improve heat dissipation property. By improving the heat dissipation property, it is possible to suppress output saturation due to the heat generated in the surface emitting laser element 151 and to improve the reliability of the operation. A portion 530A of the insulating layer 530 on the portion of the n-side contact region 957 extending in the Y-axis direction is an example of a first insulating layer, and a portion 112A of the p-side electrode 112 on the first insulating layer is an example of a first heat transfer portion. Further, a portion 112B of the p-side electrode 112 between the surface emitting laser element 151 and the p-side mesa post region 155 is an example of a second heat transfer portion, and the portion 530B of the insulating layer 530 below the heat transfer portion is an example of a second insulating layer.

Note that, also in the tenth embodiment, the insulating layer 530 that completely fills the inside of the groove 122 and the gap between the mesa structures is provided, however, the present disclosure is not limited thereto, and as in the fifth embodiment, various modifications and substitutions can be made.

In the present disclosure, the number of the n-side mesa post regions is not limited. For example, in the first to eighth embodiments, as in the ninth and tenth embodiments, the n-side mesa post region 956 extending in the Y-axis direction may be provided instead of the plurality of n-side mesa post regions 156 aligned in the Y-axis direction. In the ninth and tenth embodiments, as in the first to eighth embodiments, the plurality of n-side mesa post regions 156 arranged in the Y-axis direction may be provided instead of the n-side mesa post region 956 extending in the Y-axis direction. The n-side electrode of the surface emitting laser needs to be connected to the n-side substrate of the mount substrate at at least one position, but it is desirable that the n-side electrode of the surface emitting laser is connected to the n-side substrate of the mount substrate at a plurality of positions to ensure the redundancy.

Moreover, in the present disclosure, the n-side electrode 113 is configured to be electrically connected to the substrate 101, but the present disclosure is not limited thereto. For example, a high-concentration doped layer may be provided as a contact layer below the active layer 104, and an intra-cavity structure in which the contact layer and the n-side electrode 113 are electrically connected to each other may be employed.

Figure 27:
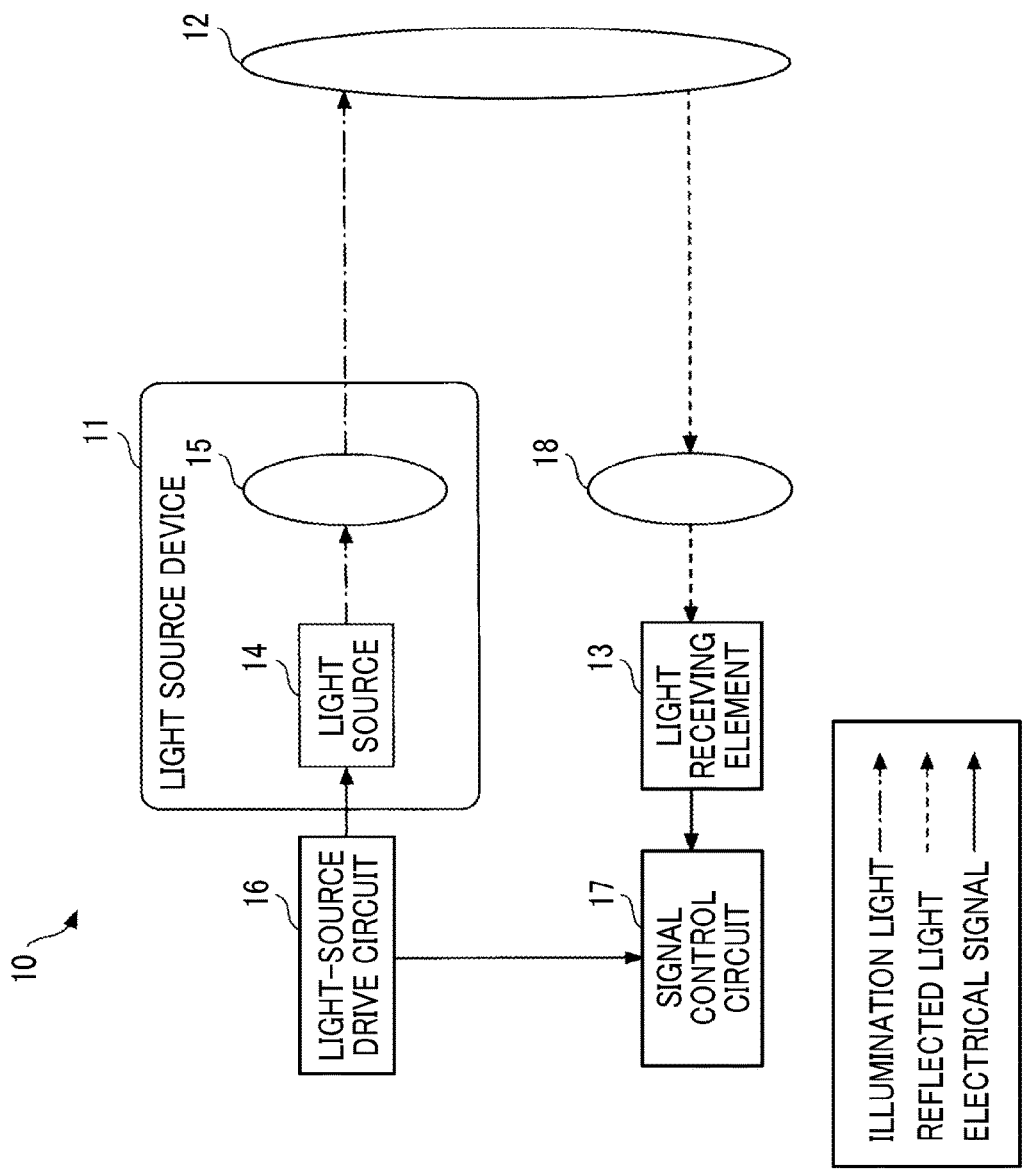
FIG. 27 illustrates an overview of a distance measuring apparatus as an example of a detection apparatus.

Next, an eleventh embodiment is described. The eleventh embodiment relates to a light source device and a detection apparatus provided with the surface emitting laser according to any one of the first to tenth embodiments. FIG. 27 illustrates an overview of a distance measuring apparatus 10 as an example of a detection apparatus.

The distance measuring apparatus 10 includes a light source device 11 as an example of a light source device. The distance measuring apparatus 10 is a time-of-flight (TOF) distance detection apparatus that provides projection (irradiation) with pulsed light from the light source device 11 to an object to be detected 12, receives the reflected light from the object to be detected 12 by a light receiving element 13, and measures the distance from the object to be detected 12 based on the time required for receiving the reflected light.

As illustrated in FIG. 27, the light source device 11 includes a light source 14 and an optical system 15. The light source 14 includes the surface emitting laser according to any one of the first to tenth embodiments, and the emission of light of the light source 14 is controlled based on electric current sent from a light-source drive circuit 16. The light-source drive circuit 16 transmits a signal to a signal control circuit 17 when the light source 14 is caused to emit light. The optical system 15 includes an optical element such as a lens, a diffractive-optical element (DOE), and a prism that adjusts the angle of divergence or direction of the light emitted from the light source 14, and irradiates the object to be detected 12 with the light.

The light that is projected from the light source device 11 and then reflected by the object to be detected 12 is guided to the light receiving element 13 through a light receiving optical system 18 that has a light focusing effect. The light receiving element 13 includes a photoelectric conversion element. The light that is received by the light receiving element 13 is photoelectrically converted, and the photo-electrically-converted light is sent to the signal control circuit 17 as an electrical signal. The signal control circuit 17 calculates the distance to the object to be detected 12 based on the time difference between the timing of light projection (i.e., the timing at which a light emission signal is input from the light-source drive circuit 16) and the timing of light reception (i.e., the timing at which a light reception signal is input from the light receiving element 13). Accordingly, in the distance measuring apparatus 10, the light receiving optical system 18 and the light receiving element 13 function as a detection system on which the light emitted from the light source device 11 and reflected by the object to be detected 12 is incident. The signal control circuit 17 may be configured so as to obtain, for example, information about the presence or absence of the object to be detected 12 and the relative velocity of the object to be detected 12, based on a signal sent from the light receiving element 13.

In the present embodiment, since a surface emitting laser having a high degree of integration of the surface emitting laser elements 151 is used, it is possible to perform detection and measurement with higher output.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A surface emitting laser comprising:
   a substrate;
   a plurality of surface emitting laser elements on a first surface of the substrate,
   a second mesa post region on the substrate to be spaced apart from one of the surface emitting layer elements,
   each of the surface emitting laser elements including:
      a first reflecting mirror on the substrate;
      an active layer on the first reflecting mirror; and
      a second reflecting mirror on the active layer;
   a first electrode electrically connected to a first conductive semiconductor of the surface emitting laser elements;
   a second electrode electrically connected to a second conductive semiconductor of the surface emitting laser elements; and
   a first contact region in which the first electrode and the first conductive semiconductor are connected to each other,
   wherein the first contact region is located on the first surface or in the first conductive semiconductor of the surface emitting laser elements,
   wherein one, or two or more of the surface emitting laser elements are defined as a light emitting unit including the second mesa post region,
   wherein the light emitting unit includes a plurality of light emitting units, and the first electrode is electrically connected to the plurality of light emitting units,
   wherein the second electrode is electrically connected to each of the light emitting units, and
   wherein a second insulating layer is provided between the second mesa post region and the one of the surface emitting laser elements, and the second electrode includes a second heat transfer portion on the second insulating layer.

2. The surface emitting laser according to claim 1, wherein a smallest distance among smallest distances between respective ones of the plurality of surface emitting laser elements and the first contact region is smaller than a largest distance among distances between the plurality of surface emitting laser elements.

3. The surface emitting laser according to claim 2, wherein the light emitting unit is located at each of one side and another side in any direction of the first contact region in plan view in a direction perpendicular to the substrate.

4. The surface emitting laser according to claim 1,
wherein the plurality of light emitting units are two-dimensionally arranged on the substrate, and
wherein the first contact region has a first portion between the light emitting units adjacent to each other.

5. The surface emitting laser according to claim 4,
wherein, when two directions parallel to the substrate and perpendicular to each other are defined as a first direction and a second direction,
the first portion extends in the first direction, and
when a set of the light emitting units arranged side by side in the first direction is defined as a light emitting unit group, the light emitting unit group includes a plurality of light emitting unit groups, and the first portion is located between the light emitting unit groups adjacent to each other in the second direction.

6. The surface emitting laser according to claim 5,
wherein the first portion includes a plurality of first portions, the light emitting unit group includes a plurality of light emitting unit groups, and the plurality of first portions and the plurality of light emitting unit groups are alternately arranged in the second direction, and
wherein the first contact region has a second portion extending in the second direction and connecting the plurality of first portions to each other.

7. The surface emitting laser according to claim 1, further comprising:
a first mesa post region provided on the substrate to be spaced apart from the plurality of light emitting units,
wherein the first electrode has a plurality of first connection portions on the first mesa post region.

8. The surface emitting laser according to claim 1,
wherein the second electrode has a second connection portion on the second mesa post region.

9. The surface emitting laser according to claim 1,
wherein the second electrode has a second connection portion on the surface emitting laser element.

10. The surface emitting laser according to claim 1, wherein light is emitted from a substrate side of the surface emitting laser.

11. A surface emitting laser device comprising:
a mount substrate; and
the surface emitting laser according to claim 1 mounted on the mount substrate.

12. A light source device comprising:
the surface emitting laser device according to claim 11; and
a driving device configured to drive the surface emitting laser device,
wherein light is emitted from the surface emitting laser to an outside of the surface emitting laser.

13. A detection apparatus comprising:
the light source device according to claim 12; and
a light receiving element capable of detecting light emitted from the surface emitting laser to the outside of the surface emitting laser and reflected by an object.

14. A surface emitting laser comprising:
a substrate;
a plurality of surface emitting laser elements on a first surface of the substrate,
each of the surface emitting laser elements including:
a first reflecting mirror on the substrate;
an active layer on the first reflecting mirror; and
a second reflecting mirror on the active layer;
a first electrode electrically connected to a first conductive semiconductor of the surface emitting laser elements;
a second electrode electrically connected to a second conductive semiconductor of the surface emitting laser elements; and
a first contact region in which the first electrode and the first conductive semiconductor are connected to each other,
wherein the first contact region is located on the first surface or in the first conductive semiconductor of the surface emitting laser elements,
wherein one, or two or more of the surface emitting laser elements are defined as a light emitting unit,
wherein the light emitting unit includes a plurality of light emitting units, and the first electrode is electrically connected to the plurality of light emitting units,
wherein the second electrode is electrically connected to each of the light emitting units, and
wherein a first insulating layer is provided on the first contact region and the second electrode includes a first heat transfer portion on the first insulating layer.

15. The surface emitting laser according to claim 14,
wherein the light emitting unit includes a second mesa post region provided on the substrate to be spaced apart from the surface emitting laser elements included in the light emitting unit, and
wherein the second electrode has a second connection portion on the second mesa post region or the surface emitting laser element.

16. The surface emitting laser according to claim 14, wherein light is emitted from a substrate side of the surface emitting laser.

17. A surface emitting laser device comprising:
a mount substrate; and
the surface emitting laser according to claim 14 mounted on the mount substrate.

18. A light source device comprising:
the surface emitting laser device according to claim 17; and
a driving device configured to drive the surface emitting laser device,
wherein light is emitted from the surface emitting laser to an outside of the surface emitting laser.

19. A detection apparatus comprising:
the light source device according to claim 18; and
a light receiving element capable of detecting light emitted from the surface emitting laser to the outside of the surface emitting laser and reflected by an object.

20. The surface emitting laser according to claim 14, wherein the first insulating layer overlaps the first contact region in a laser oscillation direction.

* * * * *